United States Patent [19]

Haga et al.

[11] Patent Number: 5,140,397
[45] Date of Patent: * Aug. 18, 1992

[54] AMORPHOUS SILICON PHOTOELECTRIC DEVICE

[75] Inventors: Koichi Haga, Ohgawara; Kenji Yamamoto, Miyagi; Masafumi Kumano, Aoyama Sendai; Akishige Murakami, Shibata, all of Japan

[73] Assignees: Ricoh Company, Ltd., Tokyo; Ricoh Research Institute of General Electronics, Shibata, both of Japan

[*] Notice: The portion of the term of this patent subsequent to Nov. 6, 2007 has been disclaimed.

[21] Appl. No.: 309,688

[22] Filed: Feb. 10, 1989

Related U.S. Application Data

[63] Continuation-in-part of Ser. No. 257,154, Oct. 11, 1988, which is a continuation of Ser. No. 840,950, Mar. 14, 1986, abandoned.

[30] Foreign Application Priority Data

| Mar. 14, 1985 | [JP] | Japan | 60-49443 |
| Mar. 25, 1985 | [JP] | Japan | 60-58487 |
| Mar. 25, 1985 | [JP] | Japan | 60-58488 |
| Apr. 12, 1985 | [JP] | Japan | 60-76525 |
| Apr. 12, 1985 | [JP] | Japan | 60-76526 |
| Apr. 12, 1985 | [JP] | Japan | 60-76527 |
| Apr. 19, 1985 | [JP] | Japan | 60-82602 |
| Apr. 22, 1985 | [JP] | Japan | 60-84535 |
| Apr. 22, 1985 | [JP] | Japan | 60-84536 |
| Apr. 23, 1985 | [JP] | Japan | 60-85365 |

[51] Int. Cl.$^5$ ............ H01L 27/14; H01L 31/06
[52] U.S. Cl. ............................ 357/30; 357/2; 357/4
[58] Field of Search .................... 357/2, 30, 4

[56] References Cited

U.S. PATENT DOCUMENTS

| 4,329,699 | 5/1982 | Ishihara et al. | 357/30 |
| 4,476,346 | 10/1984 | Tawada et al. | 357/30 |
| 4,557,987 | 12/1985 | Shirai et al. | 357/2 |
| 4,738,729 | 4/1988 | Yoshida et al. | 357/30 |
| 4,969,025 | 11/1990 | Yamamoto et al. | 357/30 |

FOREIGN PATENT DOCUMENTS

| 56-142680 | 11/1981 | Japan | 357/30 |
| 57-106179 | 7/1982 | Japan | 357/30 |

*Primary Examiner*—Jerome Jackson, Jr.
*Attorney, Agent, or Firm*—Cooper & Dunham

[57] ABSTRACT

A photoelectric device suitable for use as an image sensor includes a body of amorphous silicon and a pair of electrodes sandwiching the body. The amorphous silicon body includes at least one kind of oxygen, carbon, and nitrogen atoms and it has an ability to exhibit a predetermined level of photoconductivity for an optical bandgap of 2.0 eV or more. The amorphous silicon body may have either a mono-layered structure or a multi-layered structure. In the latter case, the body may have a p-i-n structure.

13 Claims, 16 Drawing Sheets

IRRADIATION

IRRADIATION

IRRADIATION

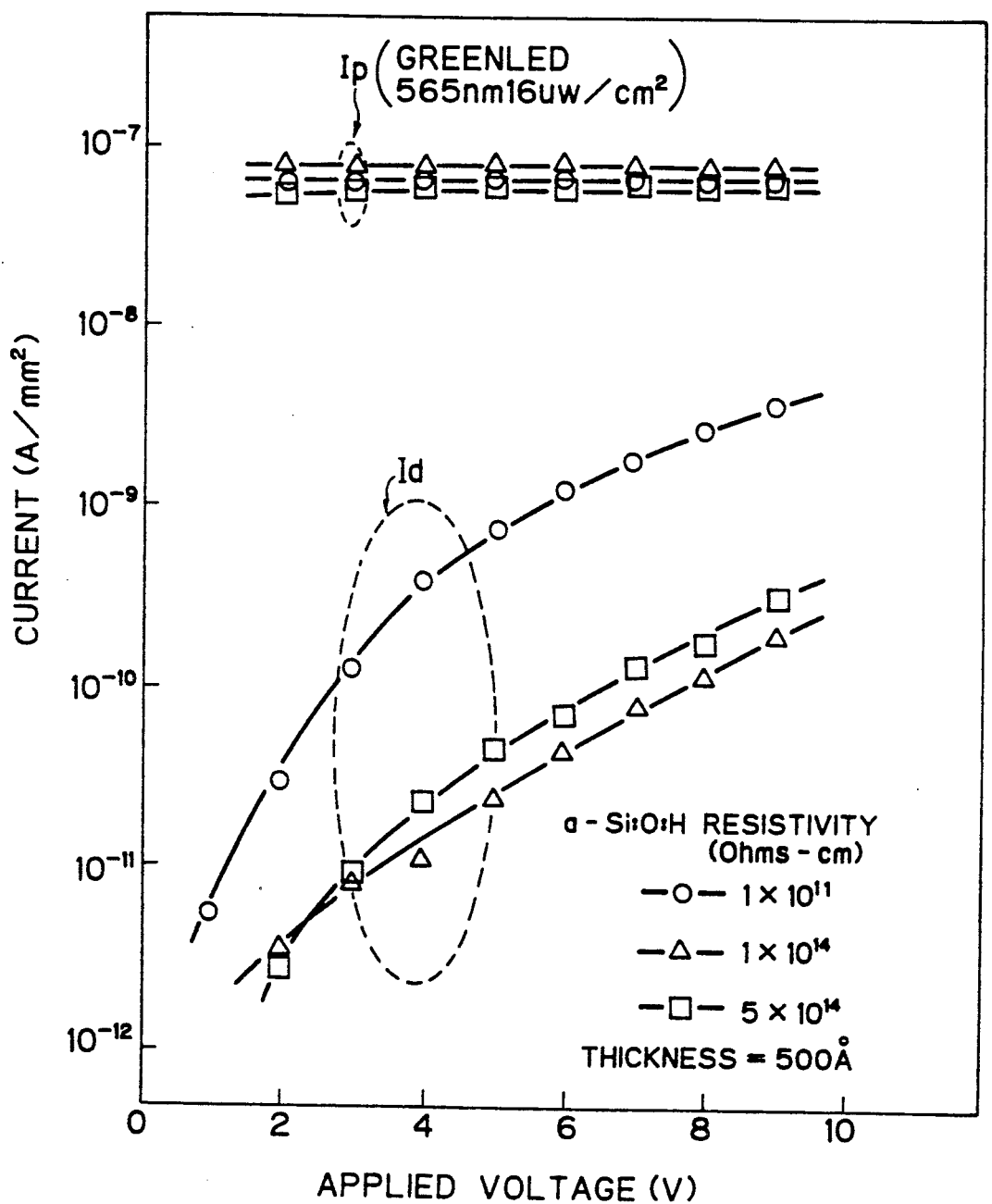

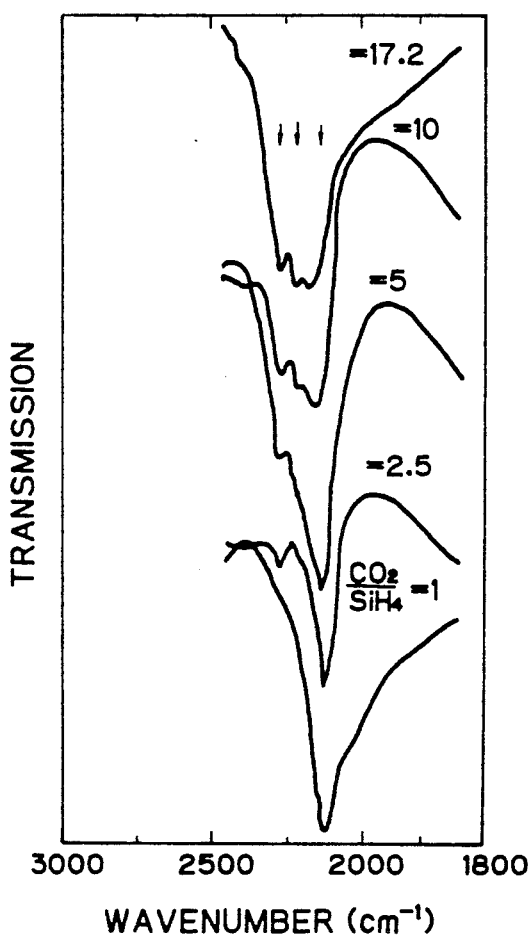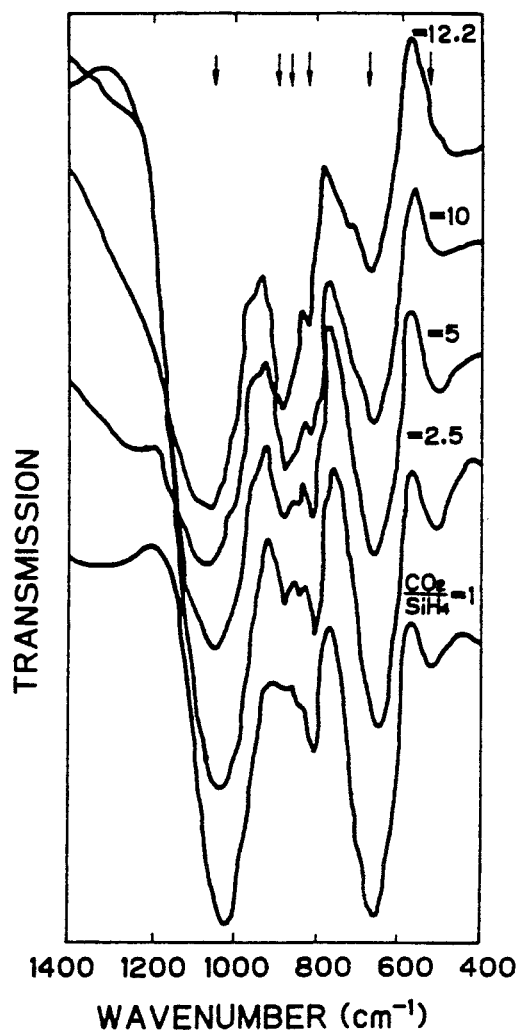

AMORPHOUS SILICON PHOTOELECTRIC DEVICE

CROSS-REFERENCES TO RELATED APPLICATIONS

This is a continuation-in-part of copending U.S. patent application Ser. No. 07/257,154 filed on Oct. 11, 1988, incorporated herein by reference, which in turn is a continuation of U.S. patent application Ser. No. 06/840,950 filed on Mar. 14, 1986 (now abandoned).

BACKGROUND OF THE INVENTION

1. Field of the Invention

This invention generally relates to a photoelectric device for converting light energy into electrical energy, and, in particular, to an amorphous silicon photoelectric device which uses amorphous silicon for providing an electrical signal in response to light radiation.

2. Description of the Prior Art

Photoelectric devices have been used in solar cells and image sensors, and some of them utilize single crystalline silicon and others utilize lately developed amorphous silicon as a material for converting light energy into electrical energy. In either case, the photoelectric device is structured to contain either a p-n or p-i-n junction, which serves to convert light energy into electrical energy.

In the case of a photoelectric device having either a p-n or p-i-n junction using single crystalline silicon, the efficiency of converting light energy into electrical energy is high, typically approximately 15%, but since use is made of single crystalline silicon as a material, there are such disadvantages as, relatively high manufacturing cost and difficulty in manufacturing a device having a relatively large surface area. On the other hand, in the case of a photoelectric device comprised of amorphous silicon, the manufacturing cost is significantly lower and a device having a large surface area can be manufactured with ease. It is to be worth noting that the photoelectric conversion efficiency of a recent device using amorphous silicon is 10% or more, and this efficiency is expected to increase more.

Typical prior art photoelectric devices using amorphous silicon, or simply a-Si, are shown in cross section in FIGS. 1 and 2. The prior art photoelectric device shown in FIG. 1 includes a light-transmitting substrate 1, such as glass, a transparent, electrically conductive film 2, such as ITO or $SnO_2$, $p^+$ type a-Si:H(B) film 4, an i type a-Si:H film 4, an $n^+$ type a-Si:H(P) film 5, and a metal electrode film 6. Such a prior art photoelectric device is disclosed, for example, by D. E. Carlson in the Journal of Electric Materials, Vol. 6, No. 2, 1977, which is hereby incorporated by reference. The other prior art structure shown in FIG. 2 is basically similar to the structure of FIG. 1; however, in the structure of FIG. 1, other atoms than B are not added to the p type layer, but, in the structure of FIG. 2, in the $p^+$ type a-Si film 7 is added C, O, or N atoms other than B so as to make it a wide band-gap film having the so-called "window effect." In this respect, $p^+$ type a-Si:C:H(B) is disclosed in Japanese Pat. Laid-open Pub. Nos. 56-64476 and 57-181176, $p^+$ type a-Si:N:H(B) is disclosed in Japanese Pat. Laid-open Pub. No. 56-96878, and $p^+$ type a-Si:O:H(B) is disclosed in Japanese Pat. Laid-open Pub. No. 56-142680.

In the photoelectric device shown in FIG. 1, it is said that the better conversion efficiency is obtained if light is irradiated in the direction indicated by the arrow. This is because, B atoms added to the $p^+$ type layer are diffused into the i type layer, thereby providing a p-i interface effective in photoelectric conversion. When light is irradiated as shown in FIG. 1, since the p type layer does not have a photoconductive characteristic, the generation of photo-carriers takes place in the i type layer. In this case, the light transmission efficiency of the p type layer determines the efficiency of generation of photo-carriers in the i type layer, so that in the visible light range, the p type layer is required to have a wider optical band gap. However, since the optical band gap of i type a-Si normally ranges between 1.7 and 1.8 eV and the optical band gap of $p^+$ type a-Si ranges between 1.4 and 1.5 eV under optimal photoelectric conversion condition, 40 to 60% of the incident light is absorbed in the p type layer by recombination or trapping without generation of photo-carriers, so that the efficiency of photoelectric conversion tends to be lower.

The structure of the other prior art device shown in FIG. 2 will now be described in detail. In the first place, it is assumed that use is made of a-Si:C:H(B). In this case, manufacture of a film of a-Si:C:H is difficult. When manufacturing a film of a-Si:C:H small in local state density, it is often said to be preferable to use the plasma CVD method and a combination of $CH_4$ and $SiH_4$ as a start gas. However, since there is a discrepancy in decomposition rate between $SiH_4$ and $CH_4$, there is a difficulty in manufacture. In addition the resulting film tends to present difficulty in being etched, which thus hinders the formation of a complicated, fine pattern. Besides, similarly with a silicon atom, since a carbon atom is a group IV element, it tends to form a dangling bond and the tolerance in manufacturing films of the same quality if rather limited, so that there is a necessity to control the manufacturing process carefully.

On the other hand, in the case where use is made of a film of a-Si:N:H(B), there is a disadvantage of inability to broaden the optical band gap in the photoconductive region (cf. J.J.A.P., Vol. 21, No. 8, 1982). Thus, if this film is used as the p type film of the p-i-n device, there is obtained a result similar to the one in the case of FIG. 1. In addition, in the case of manufacturing a film of a-Si:N:H small in local state density, it is said to be preferable to use the plasma CVD method and a combination of $N_2$ and $SiH_4$ as a start gas; however, since the decomposition rate of $N_2$ is inferior, there is a need to increase the plasma density, so that there is a disadvantage of deteriorating the characteristic of the resulting photoelectric device due to plasma damage.

As disclosed in Japanese Pat. Laid-open Pub. No. 56-142680, use may be made of a film of a-Si:O:H(B). In this case, a combination of $O_2$ and $SiH_4$ is used as a start gas; however, since $SiH_4$ and $O_2$ react momentarily, it is considered that voids of $SiO_2$ added with oxygen atoms at high density are present in the resulting film. As a result, if a small quantity of oxygen atoms is added, the optical band gap is not broadened; whereas, the addition of a large quantity of oxygen atoms allows to broaden the optical band gap. However, since a large amount of voids will be present when the optical band gap is broadened by the addition of a large quantity of oxygen atoms, there will be an increase of local state density within the film, which then deteriorates the photoconductive characteristic. In the above-raised Pat. Laid-open Publication, the characteristic of a p-i-n type device is disclosed as an example, but it is used in the range of optical band gap between 1.8 and 1.9 eV, and, thus, it indicates the difficulty in using the device with the optical band gap at 2.0 eV or more.

SUMMARY OF THE INVENTION

In accordance with the present invention, there is provided an amorphous silicon photoelectric device having a broad optical band gap while maintaining a photoconductive characteristic and a significantly large photoelectric conversion efficiency. In accordance with one aspect of the present invention, there is provided a photoelectric device having a multi-layered amorphous silicon structure which comprises at least one layer including an oxygen atom and exhibiting a photoconductive characteristic at an optical band gap of at least 2.0 eV. Alternatively, the layer including an oxygen atom may additionally include a carbon atom and also a nitrogen atom, if desired.

In accordance with another aspect of the present invention, there is provided a photoelectric device having a multi-layered amorphous silicon structure sandwiched between a pair of first and second electrodes, wherein the multi-layered amorphous silicon structure comprises a first amorphous silicon layer which is contiguous to the first electrode and which includes an oxygen atom and exhibits a resistivity ranging between $10^{12}$–$10^{14}$ ohms-cm and a photoconductive characteristic at an optical band gap of 2.0 eV or more. Alternatively, the first layer may additionally include a carbon atom and also a nitrogen atom, if desired.

In accordance with a further aspect of the present invention, there is provided a photoelectric device having a single-layered amorphous silicon structure containing at least one of a hydrogen atom, halogen atom, or heavy hidrogen atom, and a pair of electrodes sandwiching the single-layered structure which includes an oxygen atom and exhibits a photoconductive characteristic at an optical band gap of 2.0 eV or more. As alternatives, the single-layered structure may additionally include a carbon or nitrogen atom or both.

It is therefore a primary object of the present invention to obviate the disadvantages of the prior art and to provide an improved photoelectric device.

Another object of the present invention is to provide an improved photoelectric device using amorphous silicon.

A further object of the present invention is to provide an amorphous silicon having a significantly large photoelectric conversion efficiency and exhibiting a photoconductive characteristic while maintaining a large optical band gap.

A still further object of the present invention is to provide an improved amorphous silicon photoelectric device easy and thus inexpensive to manufacture virtually without limitation in surface area.

A still further object of the present invention is to provide an improved amorphous silicon photoelectric device free of $SiO_2$ voids and thus uniform in structure and excellent in characteristic.

A still further object of the present invention is to provide an improved amorphous silicon photoelectric device suitable for high speed and high density applications and extremely large in S/N ratio.

A still further object of the present invention is to provide an improved amorphous silicon photoelectric device which exhibit a substantial photoconductive characteristic at an optical band gap of 2.0 eV or more and which has a high ratio between a light conductivity and a dark conductivity.

A still further object of the present invention is to provide an improved amorphous silicon photoelectric device which has a significant sensitivity to light irradiation of short wave length.

Other objects, advantages and novel features of the present invention will become apparent from the following detailed description of the invention when considered in conjunction with the accompanying drawings.

BRIEF DESCRIPTION OF THE DRAWINGS

FIG. 30 is a graph showing variations of photocurrent $I_p$ and dark current $I_d$ as a function of applied voltage with resistivity as a parameter;

FIGS. 31a and 31b are graphs showing a relationship between the transmission of infrared light and the wave number with the flow rate ratio of $CO_2/SiH_4$ as a parameter;

DESCRIPTION OF THE PREFERRED EMBODIMENTS

In accordance with one aspect of the present invention, there is provided a photoelectric device containing a multi-layered a-Si structure which includes at least one layer comprising oxygen atoms. In this case, use is preferably made of an additive gas, such as $CO_2$, which produces oxygen atoms by the glow discharge decomposition. In accordance with this technique, when forming an a-Si film containing oxygen atoms, since the reaction does not proceed momentarily as different from the case when use is made of $O_2$ gas, no $SiO_2$ voids are produced so that the resulting film is extremely uniform in structure and an excellent photoconductivity is exhibited at an optical band gap of 2.0 eV or more.

Figure 3:
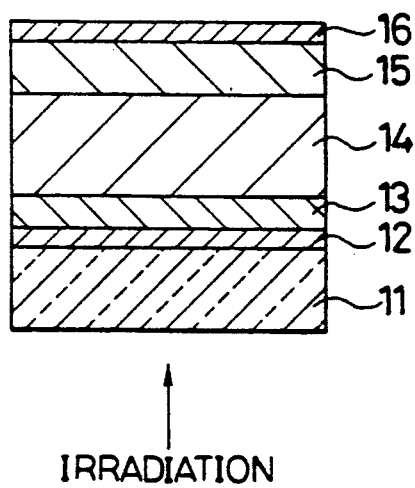
FIG. 3 is a schematic, cross-sectional view showing an amorphous silicon photoelectric device constructed in accordance with one embodiment of the present invention.

Referring now to FIG. 3, there is shown a photoelectric device having a p-i-n structure constructed in accordance with one embodiment of the present invention. As shown, the device includes a support substrate 11, a transparent, electrically conductive film 12, a p+ a-Si film 13, an i type or n− type a-Si film 14, an n+ type a-Si film 15 as overlaid one on top of another in the order mentioned. And, a metal electrode film 16 is formed as a topmost layer of the device. The support substrate 11 may be comprised of an inorganic transparent material, such as glass, or by an organic transparent material, such as polyethylene or polypropylene. The transparent, electrically conductive film 12 may be comprised of an oxide film, such as $SuO_2$ or ITO, a metal thin film, such as Pt, Al, or Au, or a silicide film, such as CrSi or InSi. For the formation of an a-Si film, use is typically made of the glow discharge decomposition method, but the sputtering method may also be used, if strong adherence is desired.

In accordance with this aspect of the present invention, oxygen atoms and group III atoms are added to the p+ type a-si film 13. For a start gas as a main constituent of an a-Si, use may be made of $SiH_4$ or $Si_2H_6$ in the case of a hydride, of $Sif_4$, $Si_2H_6$, or $SiCl_4$ in the case of a halide, and of $SiD_4$ in the case of heavy hydride. As a method for adding oxygen atoms, use is not made of a gas, such as $O_2$, which reacts momentarily with $SiH_4$, but, instead, use is made of an additive gas which produces oxygen atoms due to glow discharge decomposition. For example, for this purpose, use may be made of such additive gases as $N_2O$, $NO_2$, $N_2O_4$, $N_2O_5$, CO or $CO_2$. Use is generally made of B or Al as additives of group III atoms, and $B_2H_6$ is typically used as an additive gas of B.

In the case of i type or n− type a-Si film 14, the start gas for the main constituent is the same as the one used for the p+ film. The a-Si film 14 exhibits n− conductivity type without additives, but it exhibits i type when it contains a small quantity of group III atoms. If an increased photocurrent is desired, it is preferable to set the conductivity to be n− type. This film exhibits a highly photoconductive characteristic so that it is required to manufacture this film with care so as not to decrease the local state density.

The n+ type a-Si film 15 contains group V atoms and P and As are preferably used as the group V atoms for this purpose. Typically, $PH_3$ and $AsH_3$ are used as additive gases for causing the group V atoms to be contained in the film 15. If an increased photocurrent is desired, the n+ a-Si film 15 may be comprised of microcrystalline or polycrystalline silicon.

Figure 4:
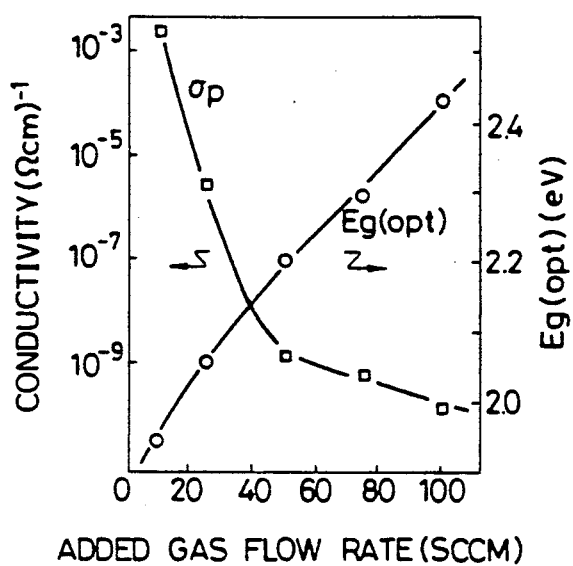
FIG. 4 is a graph showing the relation between the added gas flow rate and the optical band gap $E_g(opt)$ or light conductivity when oxygen atoms are added to an amorphous silicon film.

FIG. 4 graphically illustrates how the optical band gap $E_g(opt)$ and the photoconductivity $sigma_p$, when pseudo sunlight of AMI 100 mW/cm² is used, for a film of a-Si:O:H when used as the p type film of the device using $CO_2$ as an additive gas for adding oxygen atoms vary with respect to the amount of additive gas. As shown, the dark conductivity $sigma_d$ in the indicated range of the amount of additive gas is in the order of $10^{-13}$ ohms-cm$^{-1}$ and there is obtained $sigma_p/sigma_d$ being larger than $10^3$ at the optical band gap of 2.0 eV or more.

Figure 1:
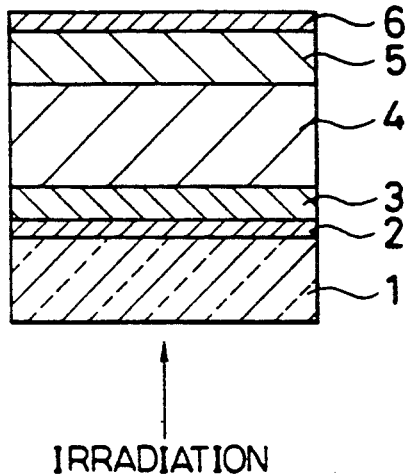
FIGS. 1 and 2 are schematic, cross-sectional views showing two typical prior art amorphous silicon photoelectric devices.
Figure 2:
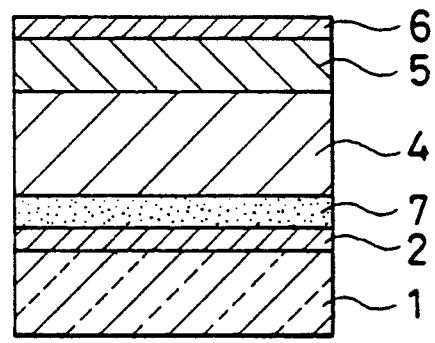
Figure 5:
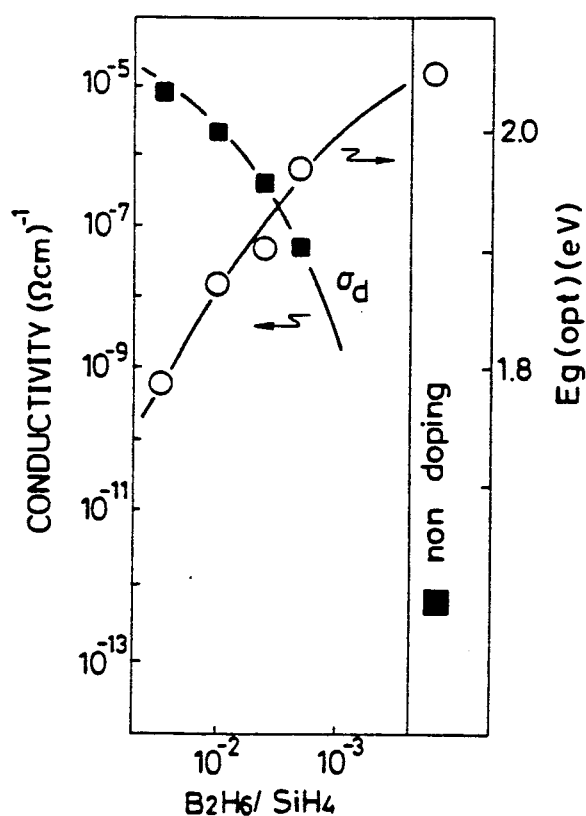
FIG. 5 is a graph showing the relation between the amount of group III atoms added to a film of a-Si:O:H and the optical band gap $E_g(opt)$ or dark conductivity.

FIG. 5 graphically illustrates how the optical band gap $E_g(opt)$ and dark conductivity $sigma_d$ vary when group III atoms are added so as to use the film of a-Si:O:H as the p+ type a-Si film 13 of FIG. 1. In the illustrated example, use was made of $B_2H_6$ as an additive gas of the group III atoms. In the graph of FIG. 5, the abscissa is taken for the ratio of $B_2H_6/SiH_4$, and when this ratio takes the value of $10^{-2}$, there is an increase of $sigma_d$ beyond seven digits as compared with $sigma_d$ without additive, which indicates that effective doping has been carried out.

In this manner, as different from the invention disclosed in Japanese Pat. Post-examination Pub. No. 56-142680, which uses $O_2$ as a start gas, in accordance with this embodiment of the present invention, it is characterized in that a film of a-Si:O:H having a high photoconductive characteristic over a broad optical band gap and capable of adding group III atoms efficiently is used as the $p^+$ type film of a photoelectric device having a p-i-n structure. Regarding the thickness of each of the films defining the photoelectric device having the p-i-n structure, the $p^+$ type film has the thickness ranging from 50 to 500 angstroms, preferably 80 to 300 angstroms, the i type film has the thickness ranging from 3,000 angstroms to 1.5 microns, preferably 4,000 to 8,000 angstroms, and the $n^+$ film has the thickness ranging from 100 to 500 angstroms, preferably 200 to 400 angstroms. In the embodiment shown in FIG. 1, it is so structured that light is incident from the side where the substrate 11 is provided; however, if a larger amount of photoelectric current is desired, it may be so structured that light is incident through the top electrode at the side where the $n^+$ film is provided. It should also be noted that, if the a-Si:O:H film of the present invention is used for the $p^+$ type and i type films of the photoelectric device having the p-i-n structure, there may be obtained a photoelectric device having a high photoelectric conversion efficiency for light having shorter wavelengths.

Now, a specific example of the conditions for manufacturing a photoelectric device according to one embodiment of the present invention will be described in detail below. It is to be noted that in each case use was made of the RF glow discharge method for forming the a-Si film.

(a) $p^+$ type a-Si film 13
 Group III dopant gas: $B_2H_6$
 O atom adding gas: $CO_2$
 Flow rate ratio:
  $CO_2/SiH_4 = 2.5$
  $B_2H_6/SiH_4 = 1 \times 10^{-2}$
  $SiH_4/H_2 = 0.1$
 Total flow rate: 172 sccm
 Substrate temp.: 250° C.
 Vacuum: 1 Torr
 RF power: 8 W
 Film thickness: 200 angstroms (b) i type a-Si film 14
 Flow rate ratio:
  $B_2H_6/SiH_4 = 0.33 \times 10^{-2}$
  $SiH_4/H_2 = 0.1$
 Total flow rate 101.1 sccm
 Substrate temp.: 250° C.
 Vacuum: 1 Torr
 RF power: 8 W
 Film thickness: 5,300 angstroms (c) $n^+$ type a-Si film 15
 Group V dopant gas: $PH_3$
 Flow rate ratio:
  $PH_3/SiH_4 = 1.5 \times 10^{-2}$
  $SiH_4/H_2 = 0.1$
 Total flow rate: 170 sccm
 Substrate temp.: 250° C.
 Vacuum: 1 Torr
 RF power: 8 W
 Film thickness: 500 angstroms In the above example, Pyrex glass was used for the substrate 11, ITO was used for the transparent, electrically conductive film 12, and an Al thin film was used for the metal electrode film 16. The current-voltage characteristic of the p-i-n type photoelectric device thus manufactured under the conditions described above is graphically shown in FIG. 6. Use was made of AMI for the incident light, and for the incident light at 100 mW/cm$^2$, there is obtained the short-circuited current of 11 mA/cm$^2$ and the open-circuit voltage of 0.66 V, which indicates an excellent characteristic as a photoelectric device.

As described above, in accordance with this embodiment of the present invention, when forming an a-Si layer of the multi-layer structure of an a-Si photoelectric device, use is made of an additive gas which produces oxygen atoms, for example, by the glow discharge decomposition instead of using $O_2$ gas which reacts momentarily with $SiH_4$, so that the formation of $SiO_2$ voids is effectively avoided and there is obtained an a-Si film having an enhanced photoconductive property at the optical band gap of 2.0 eV or more.

It will now be described as to another embodiment of the present invention which is a modification of the previously described embodiment. That is, in accordance with this embodiment of the present invention, there is provided a photoelectric device having a multi-layered structure which includes at least one a-Si film containing oxygen and carbon atoms which are produced, for example, by the glow discharge decomposition of an additive gas, such as $CO_2$ or CO. The resulting a-Si film has a significant photoconductive characteristic at the optical band gap of 2.0 eV or more and an enhanced heat-resistance characteristic. Thus, there can be obtained an a-Si photoelectric device high in performance and durability. The a-Si photoelectric device constructed in accordance with this embodiment is similar in structure as the previously described embodiment and it has a basic structure shown in FIG. 3 excepting the fact that the $p^+$ type a-Si film 13 of the present embodiment contains not only oxygen and group III atoms, but also carbon atoms. In order to have oxygen and carbon atoms contained in the a-Si film, instead of using $O_2$ gas which reacts momentarily with $SiH_4$, use is made of an additive gas, such as CO, $CO_2$ or a compound of oxygen, carbon and hydrogen, which produces oxygen and carbon atoms by the glow discharge decomposition. Oxygen and carbon atoms may be easily introduced into the a-Si film, for example, by increasing the RF power, which causes the glow discharge, over an extent which is not detrimental to the property of the a-Si film. B and Al are typical group III atoms for this purpose, and $B_2H_6$ may be preferably used as an additive gas for adding B to the a-Si film.

Figure 7:
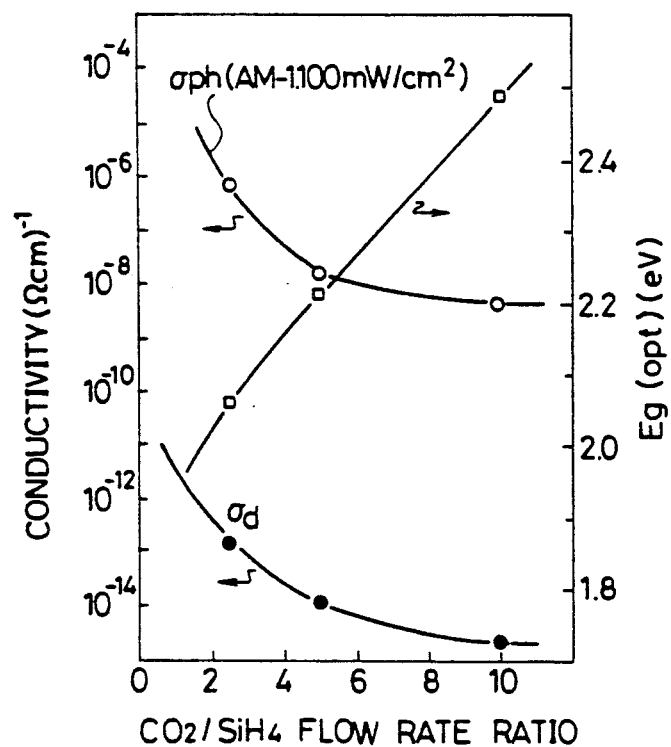
FIG. 7 is a graph showing the relation between the gas flow rate ratio of $CO_2/SiH_4$ and the optical band gap or light and dark conductivities for an a-Si film containing oxygen and carbon atoms in accordance with another embodiment of the present invention.

FIG. 7 is a graph showing how the optical band gap and the light and dark conductivities, when irradiated with AMI (pseudo sunlight) 100 mW/cm$^2$, of an a-Si film manufactured using a $CO_2$ gas as an additive gas for introducing oxygen and carbon atoms while using $SiH_4$ as a start gas of the a-Si film vary as a function of the gas flow rate ratio of $CO_2/SiH_4$, and, thus, the abscissa of the graph shown in FIG. 7 indicates the gas flow rate ratio of $CO_2/SiH_4$ and the ordinate indicates either the optical band gap or the conductivity. As indicated, for the gas flow rate ratio of $CO_2/SiH_4$ being in the range from 2.5 to 10, the dark conductivity $sigma_d$ is in a range from $10^{-12}$ to $10^{-15}$ ohms-cm$^{-1}$ and the light conductivity sigma$_{ph}$ is in a range from $10^{-6}$ to $10^{-9}$ ohms-cm$^1$, so that there is obtained the ratio of sigma$_{ph}$/sigma$_d$ being larger than $10^3$ at the optical band gap of 2.0 eV or more. It is to be noted that when B$_2$H$_6$ is used to introduce B as a group III atom into the a-Si film containing oxygen and carbon atoms so as to use it as the p$^+$ type a-Si film 13, the dark conductivity sigma$_d$ of the a-Si film will vary as a function of the gas flow rate ratio of B$_2$H$_6$/SiH$_4$ as indicated in FIG. 5. Thus, with the introduction of B as the group III atom, there ia obtained more than a seven digit increase in the dark conductivity sigma$_d$ at the gas flow rate ratio of B$_2$H$_6$/SiH$_4$ at $10^{-2}$.

It should thus be understood that the present embodiment is characterized by using an a-Si film containing oxygen and carbon atoms and having an enhanced photoconductive characteristic over a broad optical band gap, for example, as the p$^+$ layer of an a-Si photoelectric device having the p-i-n structure.

Figure 8:
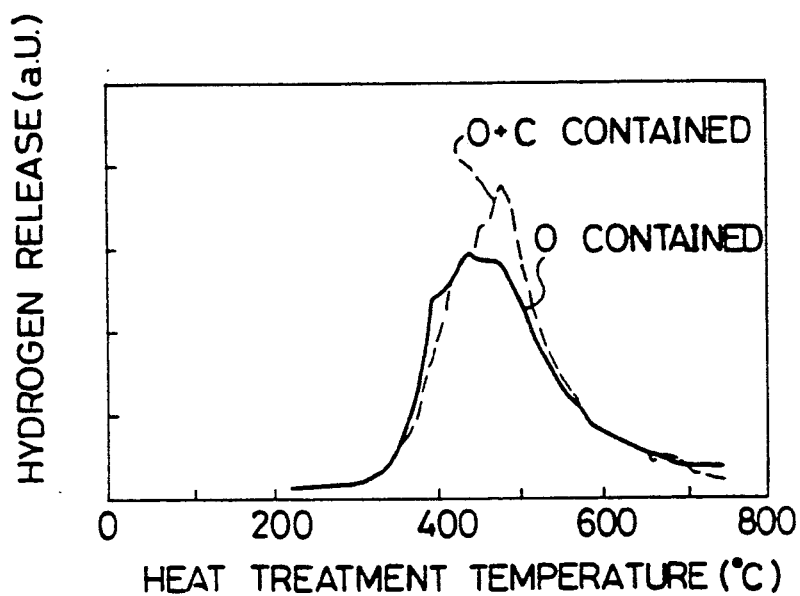
FIG. 8 is a graph showing how hydrogen release takes place when heat treatment is carried out.
Figure 9:
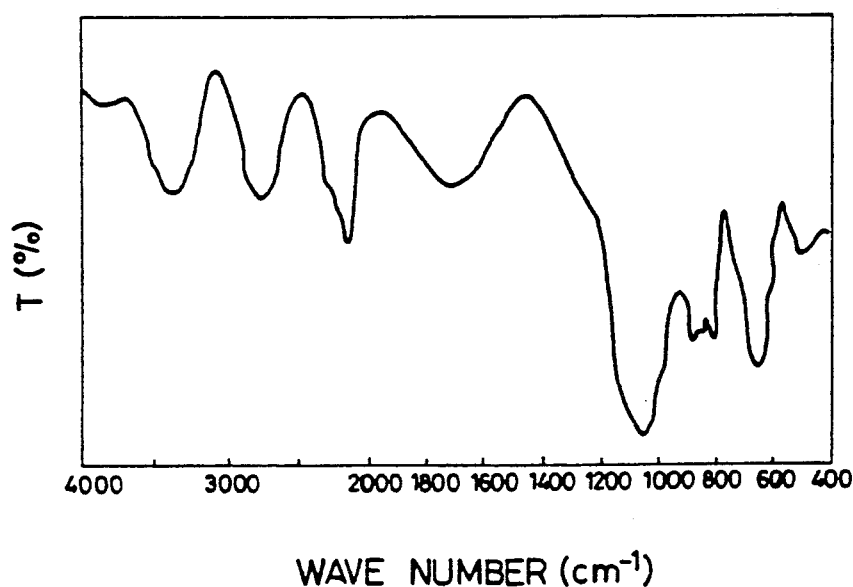
FIG. 9 is a graph showing an infrared absorption characteristic.

FIG. 8 is a graph showing the phenomenon of hydrogen release when an a-Si film is heat-treated, in which the abscissa indicates the heat treatment temperature and the ordinate indicates the amount of hydrogen released In the graph of FIG. 8, the solid line indicates the case in which only oxygen atoms are contained in the a-Si film and the dotted line indicates the case in which not only oxygen atoms but also carbon atoms are contained in the a-Si film. Of importance, the peak is shifted toward a higher temperature region when carbon atoms are added, and this indicates the fact that the durability is enhanced. On the other hand, FIG. 9 shows the infrared absorption characteristic of an a-Si film manufactured in accordance with the present embodiment using SiH$_4$ and CO$_2$ for introducing oxygen and carbon atoms into the film. The occurrence of noticeable Si-O-Si absorption is seen at 1,050 and 860 cm$^{-1}$. The presence of carbon atoms in the a-Si film has been determined by an appropriate analysis.

It should be noted that the thickness of each of the films forming the multi-layered structure of the present photoelectric device is similar to that of the corresponding film of the previously described embodiment. Moreover, in the present embodiment having the structure shown in FIG. 3, light irradiation is carried out at the side where the substrate 11 is provided; however, as an alternative, the multi-layered a-Si structure shown in FIG. 3 may be reversed. That is, it may be so structured that oxygen and carbon atoms are added to the n$^+$ film and the i type and p$^+$ type layers and the metal electrode are formed on the n$^+$ film one on top of another in this order, while maintaining the direction of light irradiation unchanged, i.e., light being irradiated from the side where the substrate is provided. As a further alternative, use may be made of a metal plate on which the n$^+$ type and i type films and the p$^+$ type film containing therein oxygen and carbon atoms are formed one on top of another in this order, and a transparent, electrically conductive film is formed on top as an electrode. In this case, light irradiation is effected from the side where the transparent, electrically conductive film is provided. As a still further alternative, using an a-Si film of an i type film part of which contains oxygen and carbon atoms, the n$^+$ type and i type films are formed on a substrate one of top of another in the order mentioned, and, furthermore, in order to form a Schottky barrier, a metal thin film of Pt or Au is formed thereon to the thickness of approximately 50 angstroms, whereby there is obtained a photoelectric device having an increased sensitivity in a shorter wavelength region.

Now, a specific example of the condition for manufacturing a photoelectric device in accordance with this embodiment of the present invention will be described in detail below. It is to be noted that the RF glow discharge method was used for forming each of the a-Si films.

Figure 6:
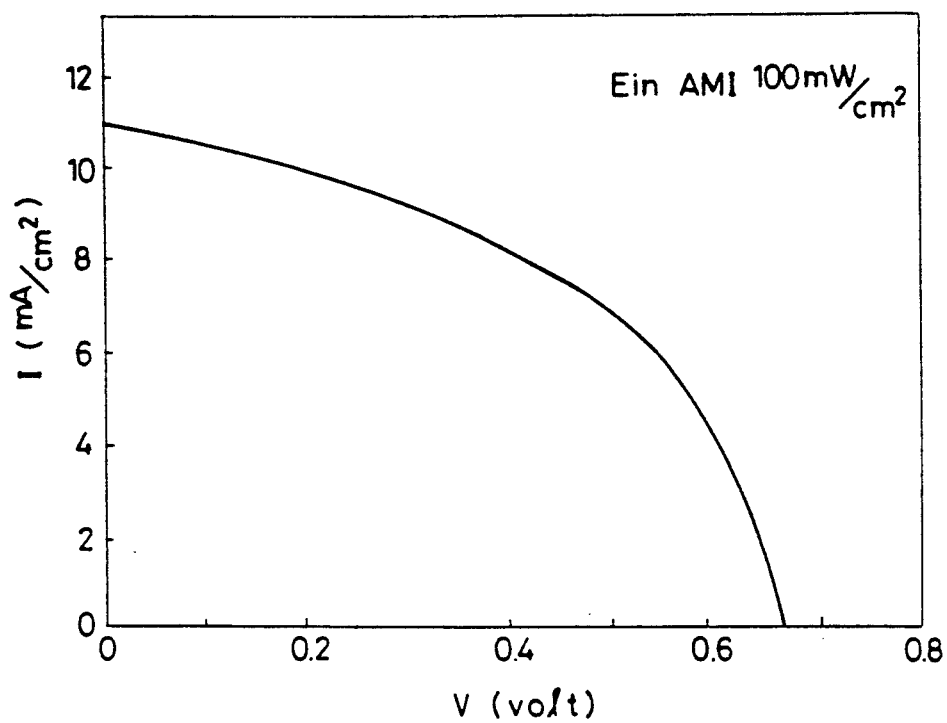
FIG. 6 is a graph showing the I–V characteristic of a p-i-n type photoelectric device embodying the present invention.

(a) p$^+$ type a-Si film 13
 Group III atom adding gas: B$_2$H$_6$
 O and C atom adding gas: CO$_2$
 Flow rate ratio:
  CO$_2$/SiH$_4$ = 5
  B$_2$H$_6$/SiH$_4$ = 1×10$^{-2}$
  SiH$_4$/H$_2$ = 0.1
 Substrate temp.: 250° C.
 Pressure: 1 Torr
 RF power: 20 W
 Film thickness: 200 angstroms (b) i type a-Si film 14
 Flow rate ratio:
  B$_2$H$_6$/SiH$_4$ = 0.33×10$^{-6}$
  SiH$_4$/H$_2$ = 0.1
 Substrate temp.: 250° C.
 Pressure: 1 Torr
 RF power: 8 W
 Film thickness: 5,300 angstroms (c) n$^+$ type a-Si film 15
 Group V atom adding gas: PH$_3$
 Flow rate ratio: PH$_3$/SiH$_4$ = 1.5×10$^{-2}$
  SiH$_4$/H$_2$ = 0.1
 Substrate temp.: 250 ° C.
 Pressure: 1 Torr
 RF power: 8 W
 Film thickness: 500 angstroms In this specific example, Pyrex glass was used for the substrate 11, ITO was used for the transparent, electrically conductive film 12, and an Al thin film was used for the metal electrode film 16. The resulting a-Si p-i-n type photoelectric device has been found to possess the similar current-voltage characteristic as shown in FIG. 6. Similarly with the previously described embodiment, when tested using AM1 as the incident light, the short-circuited current of 11 mA/cm$^2$ and the open-circuit voltage of 0.66 V were obtained for the amount of incident light at 100 mW/cm$^2$.

A still further embodiment of this aspect of the present invention will now be described. In accordance with this embodiment, there is provided a photoelectric device including an a-Si film serving as a "window" film which contains oxygen, carbon and nitrogen atoms. That is, a photoelectric device constructed in accordance with the present embodiment includes a multi-layered a-Si structure which comprises at least one layer containing therein oxygen, carbon and nitrogen atoms which are produced, for example, by the glow discharge decomposition of an additive gas, such as a mixture gas of CO$_2$ and N$_2$. Similarly with the previously described embodiments in the present aspect of the present invention, instead of using O$_2$ gas which reacts momentarily with SiH$_4$, in accordance with the present embodiment, use is made of an additive gas which does not react momentarily with SiH$_4$ when forming an a-Si film containing oxygen, carbon and nitrogen atoms, so that the resulting a-Si film is virtually free of SiO$_2$ voids, thus has an extremely fine and uniform property, and exhibits a significant photoconductive characteristic for the optical band gap energy at 2.0 eV or more. With such an a-Si film provided as a "window" film in the multi-layered a-Si structure, the incident light can be utilized effectively and thus there is provided an a-Si photoelectric device extremely high in photoelectric conversion efficiency. It should also be noted that an a-Si film containing oxygen, carbon and nitrogen atoms is enhanced in heat-resistance characteristic and durability.

A photoelectric device constructed in accordance with this embodiment also has a basic structure shown in FIG. 3, which may be fabricated in a similar manner excepting the step of formation of the p+ type a-Si film 13. That is, in accordance with the present embodiment, the p+ type a-Si film 13 is formed to contain therein oxygen, carbon, and nitrogen atoms in addition to group III atoms. As a method for introducing oxygen, carbon, and nitrogen atoms into the film 13, instead of using gases, such as $O_2$, which react directly and momentarily with $SiH_4$, an additive gas, such as a mixture of $CO_2$ and $N_2$, which produces oxygen, carbon, and nitrogen atoms indirectly, for example, through the glow discharge decomposition is used.

Figure 10:
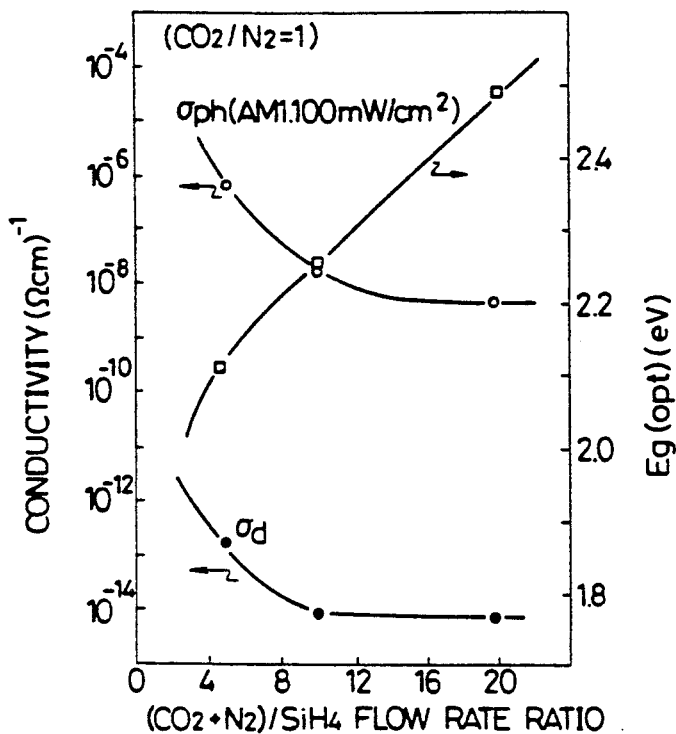
FIG. 10 is a graph showing the relation between the gas flow rate ratio of $(CO_2+N_2)/SiH_4$ and the optical band gap or light and dark conductivities for an a-Si film containing oxygen, nitrogen and carbon atoms in accordance with a further embodiment of the present invention.

FIG. 10 is a graph showing how the optical band gap and the light and dark conductivities, when irradiated with AM1 (psuedo sunlight) of 100 mW/cm$^2$, of an a-Si film formed using $SiH_4$ as a start gas and a mixture gas of $CO_2$ and $N_2$ as an additive gas for adding oxygen, carbon, and nitrogen atoms vary as a function of the gas flow rate ratio of $(CO_2 + N_2)/SiH_4$. Thus, in the graph of FIG. 10, the abscissa is taken for the gas flow rate ratio of $(CO_2+N_2)/SiH_4$ and the ordinate is taken for either the conductivity or the optical band gap. As shown, for the gas flow rate ratio ranging 5 to 20, the dark conductivity sigma$_d$ is in a range between $10^{-12}$ and $10^{15}$ ohms-cm$^{-1}$ and the light conductivity sigma$_{ph}$ is in range between $10^{-6}$ and $10^{-9}$ ohms-cm$^{-1}$, whereby there is obtained the ratio of sigma$_{ph}$/sigma$_d$ being larger than $10^3$ with the optical band gap at 2.0 eV or more.

Figure 11:
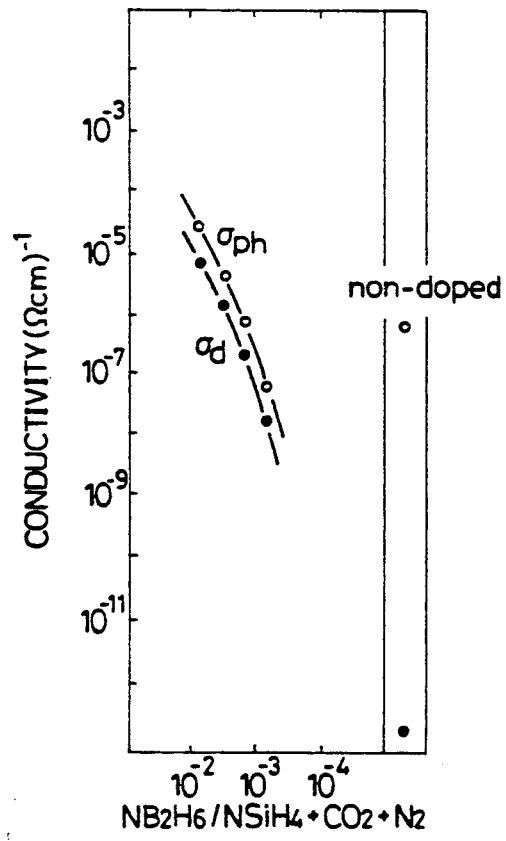
FIG. 11 is a graph showing the relation between how the light and dark conductivities vary when the a-Si film containing oxygen, nitrogen, and carbon atoms is doped with group III element B.

FIG. 11 graphically shows how the light and dark conductivities vary when group III atoms are added so as to use the a-Si film containing therein oxygen, carbon, and nitrogen atoms as the p+ type a-Si film 13 of the device shown in FIG. 3. In the graph of FIG. 3, the abscissa is taken for the gas flow rate ratio of $B_2H_6/SiH_4+CO_2+N_2$ and the ordinate is taken for the conductivity. In this case, $B_2H_6$ was used as an additive gas for adding B as the group III atom. With the introduction of B atoms as the group III atom, with the gas flow rate ratio of $B_2H_6/SiH_4+CO_2+N_2$ at $10^{-2}$, the dark conductivity sigma$_d$ produces more than a seven digit change. Under the condition, the a-Si film possesses a significant photoconductive characteristic, which indicates the fact that the film has an excellent property.

In accordance with the feature of this embodiment, an a-Si layer containing therein oxygen, carbon, and nitrogen atoms and capable of exhibiting a significant photoconductive characteristic with the optical bandgap at 2.0 eV or more may be fabricated using a hydride, such as $SiH_4$, and an additive gas, such as a mixture gas of $CO_2$ and $N_2$, according to the glow discharge decomposition method, as described above. That is, $SiH_4$ is decomposed by the energy of glow discharge and thus a-Si becomes deposited, and, at the same time, $CO_2$ is decomposed to introduce oxygen and carbon atoms into the film being formed. Since the excitation energy provided by glow discharge is close to the level of the excitation energy of $CO_2$, when it proceeds to the excitation of $CO_2$, $N_2$ gas serves as a catalyst to promote the decomposition of $CO_2$ and part of the $N_2$ gas is introduced into the a-Si film being formed in the form of nitrogen atoms.

In the a-Si film of the present embodiment which contains therein oxygen, carbon, and nitrogen atoms, it is the oxygen atoms that have the primary role in determining the optical and electrical properties; however, with the introduction of carbon and nitrogen atoms, not only those hydrogen atoms which are bonded to the oxygen, carbon, and nitrogen atoms, but also those hydrogen atoms which are bonded to Si atoms are stabilized, and the peak of hydrogen release by heat treatment is shifted to a higher temperature region, thereby providing an enhanced heat-resistance property. It should also be noted that the introduction of nitrogen atoms provides an added advantage of minimizing the change of conductivity due to light irradiation.

As described above, in accordance with the present invention, an a-Si film can be formed using relatively low RF power in contrast to the prior art method using $CH_4$ for forming a film of a-Si:C:H, so that there can be obtained an a-Si film having less damages due to ion bombardment, exhibiting a significant photoconductive characteristic, and having an excellent property. Preferably, the thickness cf each of the films defining the photoelectric device of the present embodiment may have values indicated with respect to the previously described embodiments. It should also be noted that the present embodiment may also be modified as indicated earlier in various manners. As a further alternative, an a-Si film containing therein oxygen, carbon, and nitrogen atoms or an a-Si film containing also group III atoms in addition to those already mentioned is thinly formed at the p-i interface, and the amount of contents of each of the oxygen, carbon, and nitrogen atoms is controlled such that the difference in optical bandgap of the hetero-junction at the p+ type and i type layers changes gradually, thereby providing a matching of lattice constant, which will aid in further increasing the photoelectric conversion efficiency.

Now, a specific example for the condition for manufacturing a photoelectric device according to the present embodiment will be described in detail below. It is to be noted that each of a-Si films was fabricated by the RF glow discharge method.

(a) p+ type a-Si film 13
  Group III atom adding gas: $B_2H_6$
  O, N, and C atom adding gas: $CO_2 + N_2$
  Flow rate ratio:
    $CO_2/SiH_4 = 5$
    $CO_2/N_2 = 1$
    $B_2H_6/SiH_4 = 1 \times 10^{-2}$
    $SiH_4/H_2 = 0.1$
  Substrate temp.: 250 °C.
  Pressure: 1 Torr
  RF power: 15 W
  Film thickness: 200 angstroms (b) i type a-Si film 14
  Flow rate ratio:
    $B_2H_6/SiH_4 = 0.33 \times 10^{-6}$
    $SiH_4/H_2 = 0.1$
  Substrate temp.: 250° C.
  Pressure: 1 Torr
  RF power: 8 W
  Film thickness: 5,300 angstroms (c) n+ type a-Si film 15

Group V atom adding gas: PH$_3$
Flow rate ratio:
 PH$_3$/SiH$_4$=1.5×10$^{-2}$
 SiH$_4$/H$_2$=0.1
Substrate temp.: 250° C.
Pressure: 1 Torr
RF power: 8 W
Film thickness: 500 angstroms Also in this specific example, Pyrex glass was used for the substrate 11, ITO was used for the transparent, electrically conductive film 12, and an Al thin film was used for the metal electrode film 16. The resulting p-i-n type photoelectric device of the present embodiment has been found to possess the I-V characteristic shown in FIG. 6.

Now, another aspect of the present invention will be described hereinbelow. Prior art amorphous image sensors include CdS-CdSe family sensors, Se-Te-As family sensors, and amorphous silicon family sensors. Among them, the CdS-CdSe family sensors are slow in light responsiveness and the Se-Te-As family sensors have a disadvantage of being crystallized at low temperatures, so that these family sensors have difficulty in providing an excellent photoelectric device high in density and fast in operation. Under the circumstances, amorphous silicon has attracted much attention as a possible material for manufacturing a photoelectric device having a large surface area, a large light absorption coefficient, and an excellent photoconductive characteristic. As an image sensor, one application of photoelectric device, using amorphous silicon, the so-called planar type amorphous silicon image sensor is known and it is so structured that a pair of electrodes is formed on the same substrate in the same plane and an amorphous silicon film is formed as bridging between the pair of electrodes. This type of image sensor is simple in structure and thus easy to manufacture so that a relatively large number of such image sensors have been manufactured for test purposes. However, this type of image sensors is slow in light responsiveness from its structural constraints so that its application to high-speed facsimile machines will encounter numerous difficulties. This is because, in the planar type a-Si image sensor, the gap between the pair of electrodes must be large in the order of approximately 10 microns, so that it takes time for carriers, such as electrodes, to traverse the gap. In addition, since the pair of electrodes is formed side-by-side on the same plane, it is difficult to increase the density.

In order to obviate the various disadvantages present in the planar type image sensor, there have been proposed the so-called sandwich type a-Si image sensor, in which an amorphous silicon film is sandwiched between a transparent electrode and another electrode, as a promising image sensor high in density and thus in resolution and fast in operation. However, in the structure of the sandwich type image sensor, the dark current, i.e., current under dark condition, increases due to the injection of charge from the base electrode at the time of application of bias voltage so that it is disadvantaged in that the ratio between and light and dark currents, or S/N ratio, cannot be large. Besides, since amorphous silicon has a large light absorption coefficient and thus it is formed to be thin, typically ranging between 5,000 angstroms and 1 micron, there is a problem of shorting between the pair of electrodes due to the production of pin holes.

In order to decrease the dark current, it has been proposed to provide another thin electrically insulating film between the amorphous silicon body and the electrode, thereby blocking the charge from the electrode from being injected into the amorphous silicon body. The image sensor having such a blocking structure is often referred to as MIS (Metal-Insulator-Silicon) type image sensor. The insulating film may be comprised, for example, of a film of silicon oxide, silicon nitride, or metal nitride, or the like. For example, in Japanese Pat. Laid-open Pub. No. 57-106189, it is described that an oxide film is formed on an amorphous silicon body by subjecting a surface of the amorphous silicon body to anode plasma oxidation or causing glow discharge to silane gas containing oxygen. However, according to this described method, the thickness of the insulating film ranges from 20 to 40 angstroms and it is difficult to form the insulating film across the entire surface of the high density device uniformly. Furthermore, in general, when a thin film of 100 angstroms or less in thickness is to be formed, it tends to be patchy so that it is very difficult to provide an image sensor of uniform quality. If the insulating film is made thicker so as to make the quality of an image sensor uniform and consistent, the injection of dark current can be sufficiently blocked, but the carriers produced with the application of light are also blocked significantly, thereby deteriorating the S/N ratio.

Japanese Laid-open Pub. No. 56-26478 discloses the method to use nitride (light-transmitting, current-passing, electrically insulating or half insulating) as a thin electrically insulating film. According to the teaching of this reference, if an oxide is used, since it has a large energy bandgap, it presents by itself a significant barrier against the flow of current even if the oxide film is thin, so that the passage of carriers even during application of light becomes difficult, thereby lowering the S/N ratio. In view of this, this reference teaches to use nitride, which has a smaller energy bandgap than oxide, in forming the insulating film. Even in this case, the nitride film must be made as thin as 50 to 100 angstroms, and, moreover, in the case where the insulating film is formed after formation of individual electrodes, it is normally the case to form the insulating film after formation of the individual electrodes by etching, so that difficulty is also present in forming the insulating film uniform in thickness on the side surface or at the edge portion of the electrode. Thus, similarly with the case using oxide, there is a difficulty in providing devices uniform in characteristic.

On the other hand, Japanese Pat. Laid-open Pub. 56-14268 proposes a photoconductive semiconductor device which has a multi-layered amorphous silicon structure, which, in turn, includes at least one layer containing oxygen atoms and impurities for controlling the concentration of charge carriers. However, if the optical bandgap is broadened by adding oxygen atoms, photoconductivity is exhibited in a range between 1.85 and 1.92 eV, but no photoconductive characteristic is exhibited for the optical bandgap larger than this range. As a result, if a thin film having the optical bandgap of 2.0 eV or more is used to block injection of the charge under dark condition, the carriers produced due to application of light are also blocked, which thus hinders to obtain an image sensor large in S/N ratio.

Accordingly, in accordance with this aspect of the present invention, there is provided a sandwich type amorphous silicon photoelectric device suitable for high-speed and high-density applications, large in S/N ratio and uniform in characteristic. In accordance with one embodiment of this aspect of the present invention, there is provided a photoelectric device including a pair of electrodes and a multi-layered amorphous silicon body sandwiched between the pair of electrodes, wherein the amorphous silicon body includes an amorphous silicon layer which is contiguous to one of the pair of electrodes and which contains oxygen atoms, has the optical bandgap of 2.0 eV or more, has the resistivity of $10^{12}-10^{14}$ ohms-cm, and exhibits photoconductivity. Since the layer of the amorphous silicon contiguous to one of the electrodes has a relatively high resistivity ranging between $10^{12}$ and $10^{14}$ ohms-cm, the injection of charge from the electrode into the amrophous silicon body is effectively blocked, and, at the same time, since it has a significant photoconductive characteristic, the charge carriers produced with the application of light can be sufficiently passed therethrough. With this structure, an extremely high S/N can be obtained.

Figure 12:
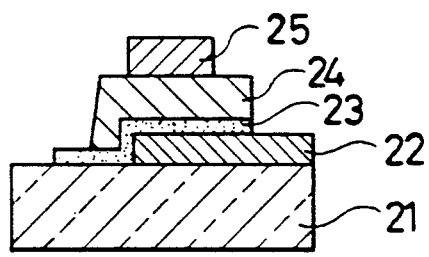
FIG. 12 is a schematic, cross-sectional view showing an amorphous silicon photoelectric device constructed in accordance with another embodiment of the present invention.
Figure 13:
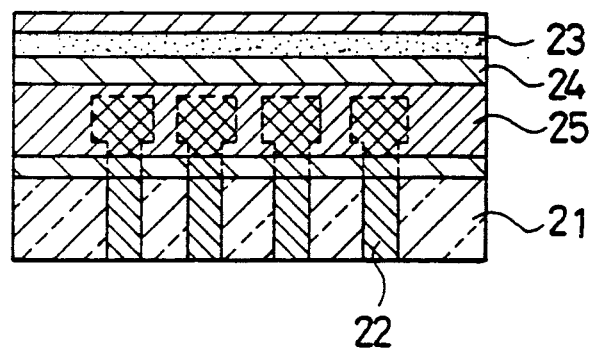
FIG. 13 is a schematic, plan view of the photoelectric device shown in FIG. 12.
Figure 14:
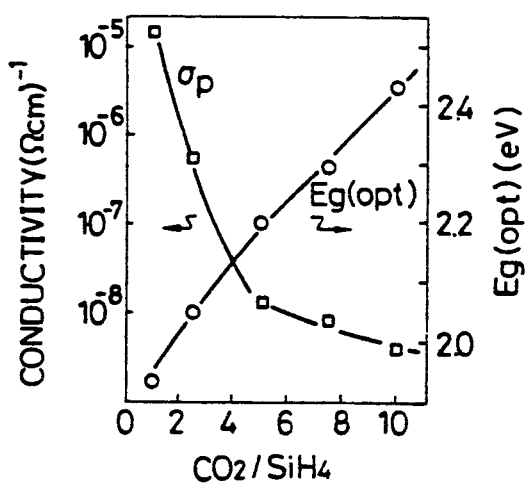
FIG. 14 is a graph showing the relation between the amount of oxygen gas added to an a-Si film and the optical band gap or light conductivity.

Referring now to FIGS. 12 and 13, there is schematically shown a photoelectric device or image sensor device constructed in accordance with one embodiment of this aspect of the present invention when applied as an image sensor. As shown, the illustrated image sensor includes a transparent glass substrate 1, a first electrode 22 formed from a transparent, electrically conductive film of ITO, $SnO_2$ or the like, a first amorphous silicon layer 23, a second amorphous silicon layer 24, and a second electrode 25 formed from a metal film of Al, Cr, or the like. A specific method for manufacturing the structure shown in FIG. 12 will be described in detail below. In the first place, on the transparent glass substrate 21 is uniformly formed an ITO film to the thickness of 800 angstroms by the vacuum evaporation method, which is then selectively removed by a photolithography technique to form the first (individual) electrode 2. This individual electrode has a size of 100 microns $\times$ 100 microns and the interelectrode distance is set at 25 microns. This substrate was then placed inside a CVD apparatus, and, then, while introducing a mixture gas of $CO_2$ and $SiH_4$ at a mixture ratio of 2.5, the first amorphous silicon film 23 was formed to the thickness of 350 angstroms by glow discharge decomposition at RF power of 25 mW/cm². The resulting film 23 had a resistivity of $9 \times 10^{12}$ ohms-cm and an optical bandgap of 2.05 eV. At this step, the vacuum was set at 1.0 Torr and the substrate temperature was set at 250° C. while using a SUS mask. Then, $SiH_4$ was introduced and the second amorphous silicon film 4 was formed by the glow discharge decomposition to the thickness of 1.25 microns. The conditions, such as degree of vacuum, at this step were identical to those at the step for forming the first amorphous silicon layer 23. Finally, the second (common) electrode 25 of Al film was formed by the vacuum evaporation using a SUS mask to the thickness of 5,000 angstroms with the width of 150 microns. It is to be noted that the patterning may be carried out either using a mask or once forming a blanket film across the entire surface and then photolithographically removing selected sections. The resulting amorphous silicon image sensor has an extremely high S/N ratio, e.g., the ratio between the light current with illumination of 100 luxes and the dark current without illumination being $5 \times 10^3$, and each sensor element associated with the corresponding individual electrode has a uniform characteristic.

Figure 16:
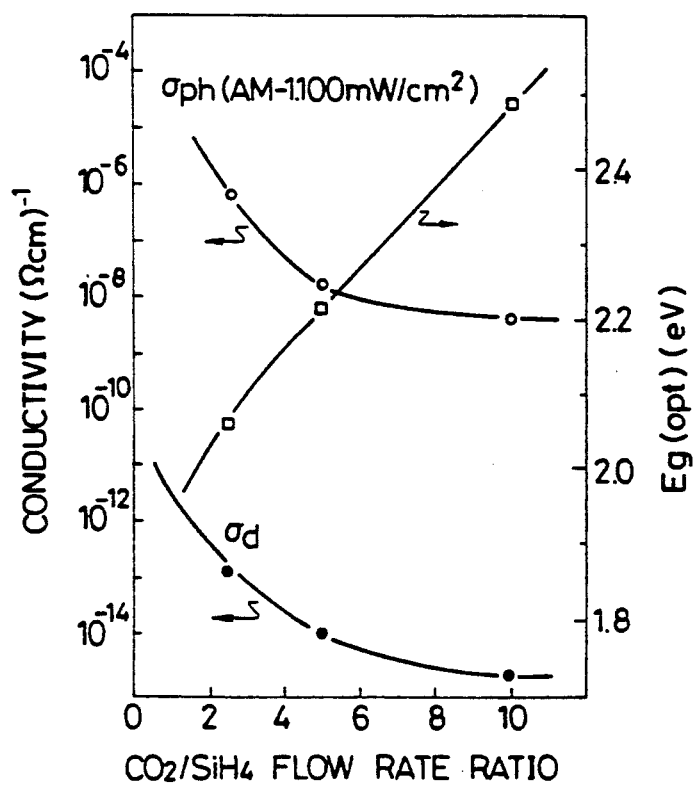
FIG. 16 is a graph showing the relation between the gas flow rate ratio of $CO_2/SiH_4$ and the optical band gap or light and dark conductivities for an a-Si film added with oxygen and carbon atoms.
Figure 32:
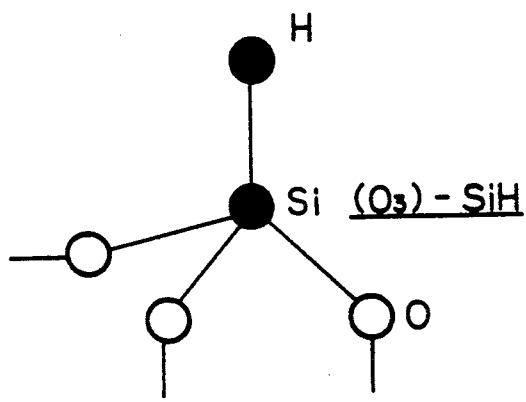
FIG. 32 is a schematic illustration showing the structure of a model inferred from the infrared absorption shown in the graphs of FIGS. 31a and 31b.
Figure 33:
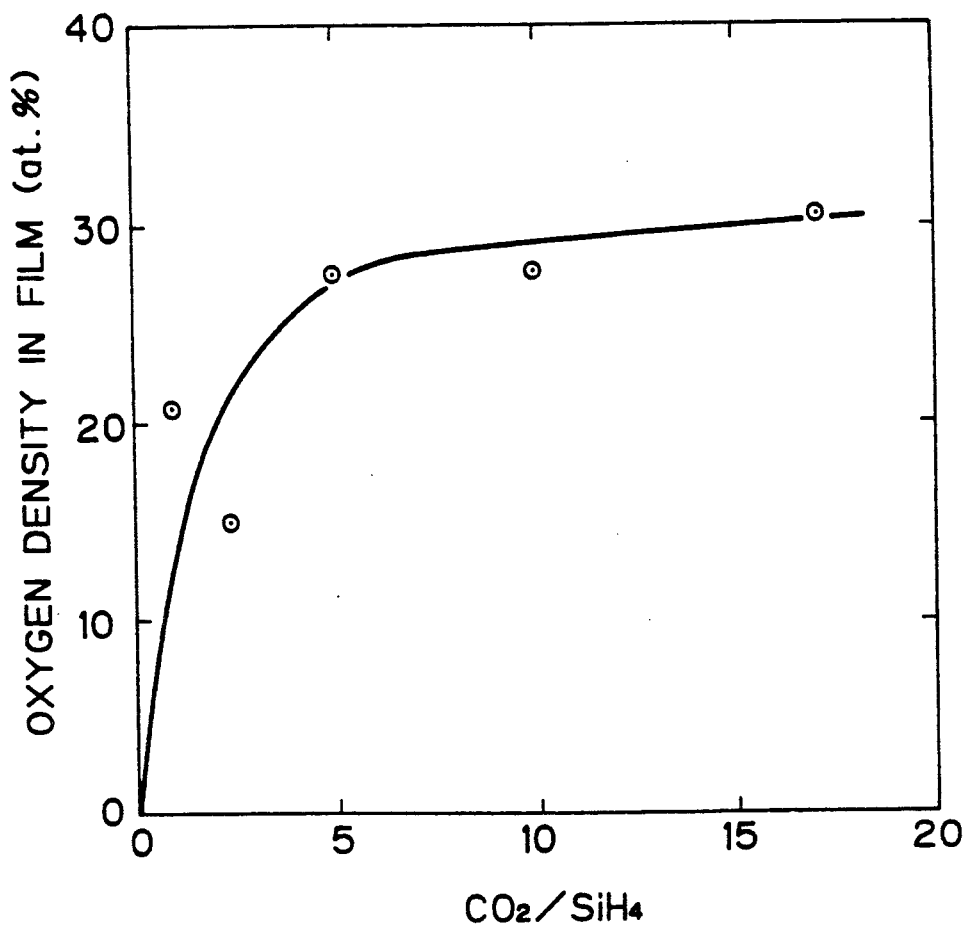
FIG. 33 is a graph showing a relationship between the oxygen density in a film and the flow rate ratio of $CO_2/SiH_4$.

FIG. 16 graphically illustrates how the optical bandgap $E_g(opt)$ and the light conductivity sigma$_{ph}$, using the psuedo sunlight of AMI 100 mW/cm², of the first amorphous silicon film 23 vary as a function of the amount of additive gas in the case where a mixture gas of $CO_2$ and $SiH_4$ was used to add oxygen atoms to the film 23. As the ratio of $CO_2/SiH_4$ increases, the optical bandgap gradually increases. On the other hand, the light conductivity sigma$_{ph}$ decreases gradually up to around the point where the ratio of $CO_2/SiH_4=5$, but it levels off approximately at $10^{-8}$ ohms-cm$^{-1}$; whereas, the dark conductivity sigma$_d$ decreases gradually up to around the point where the ratio of $CO_2/SiH_4$-2.5 and it levels off approximately at $10^{-13}-10^{-14}$ ohms-cm$^1$. Thus, the first amorphous silicon film 23 containing oxygen atoms and exhibiting photoconductivity with the optical bandgap at 2.0 eV or more has a significantly high resistivity ranging between $10^{13}$ and $10^{14}$ ohms-cm under dark condition. The first amorphous silicon film 23 exhibits an extremely high dark resistivity in a range between $10^{12}$ and $10^{15}$ ohms-cm. Such a high dark resistivity significantly contributes to a reduction of dark current in the present structure. That is, in order to obtain a high S/N ratio, an effort must be made to increase photocurrent and to reduce dark current. FIG. 30 shows variations of photocurrent $I_p$ and dark current $I_d$ of the present image sensor as a function of applied voltage with the dark resistivity taken as parameters. As may be understood from FIG. 30, for dark resistivity=$1 \times 10^{11}$ ohms-cm, $I_d$ increases and it exhibits a value which is approximately 1.5 times higher than the values for dark retentivities of $1 \times 10^{14}$ and $5 \times 10^{14}$ at applied voltage equal to 5 V, so that it is difficult to obtain a high S/N ratio. Besides, as the first amorphous film 23 increases its resistivity, the dark current of the sensor decreases and similarly the photocurrent slightly decreases. Although not shown in FIG. 30, it has been found that if the dark resistivity of silicon atoms has a value equal to $10^{15}$ ohms-cm or more, the photocurrent $I_p$ of the sensor decreases by an order of magnitude as compared with the case of dark resistivity equal to $1 \times 10^{14}$ ohms-cm. Thus, it can be concluded that as a range of resistivity for the first amorphous silicon film 23, a range between $10^{12}$ and $10^{15}$ ohms-cm is preferred in order to obtain a high S/N ratio. From this, it can be understood that, in the present image sensor, the first amorphous silicon layer 23 has a sufficient function of preventing the injection of carriers from an electrode under dark condition. On the other hand, this film 23 has a significantly low resistivity ranging between $10^7$ and $10^8$ ohms-cm under light condition of pseudo sunlight illumination at AMI 100 mW/cm², so that it has a function of facilitating the carriers produced by illumination to pass therethrough. This function is attributed to the fact that the first amorphous silicon film 23 is formed from an oxide film of a structure having less traps. For the sole purpose of high resistivity and wide optical bandgap, an oxide, a carbide, or a nitride is conceivable. However, if fine processing is to be considered additionally, it is preferable that an oxide is a main component. However, it was fundamentally difficult for this film to have a good photoconductive characteristic which allows an easy passage of carriers produced by light irradiation as described in Japanese Patent Laid-open Publication No. 57-106179. This is because, since there is produced $SiO_2$ which tends to disect the network in silicon to thereby increase the number of traps defined by dangling bonds, which, in turn, makes it difficult for photocarriers to pass and hinders to obtain a good photoconductive characteristic. However, according to the recent development in the CVD method, it is now possible to produce an oxygen atom-added amorphous silicon film having a SiO bond from SiH$_4$ gas and O$_2$ gas. However, in this method, use is made of Si$_{H4}$ which directly reacts with O$_2$ gas so that there can only be obtained SiO or SiO$_2$ bonds, and, therefore, the photoconductivity would disappear at a wide optical bandgap of 2.0 eV or more as described in Japanese Patent Laid-open Publication No. 56-14268. In accordance with the present invention, it has succeeded in obtaining a photoconductive characteristic and a high dark conductivity even in a wide bandgap by providing a particular structure to the first amorphous silicon film 23. FIGS. 31a and 31b illustrate infrared transmission spectral data showing this structure. In these figures, the abscissa is taken for the wave number and the ordinate is taken for the transmission. In a range of the flow rate of CO$_2$/SiH$_4$ of 2.5 or above used in the present image sensor, it is seen that there is an increase in absorption at 2,275 and 880 cm$^{-1}$. FIG. 32 is a schematic showing this structure. As described by Lucovsky in Solid State Communication, Vol. 29, pp. 571–576, the structure of (O$_3$)-SiH can be determined from the infrared transmission spectrum, and the corresponding absorption spectra are 2,275 and 880 cm$^{-1}$. This structure includes three oxygen atoms for one silicon atom as compared with SiO and SiO$_2$ bonds. As a result, a large amount of oxygen atoms are contained in the film so that there is obtained a film having less dangling bonds without disruption of silicon four-orientation structure. Such a structure allows the carriers produced by light irradiation to pass effectively, which is the reason why a high photoconductivity is obtained. FIG. 33 shows the oxygen density in the first amorphous silicon film 23 of the present image sensor. Particularly, FIG. 33 shows a relationship between the flow rate ratio of CO$_2$/SiH$_4$ and the oxygen density in the film. It is seen that the present image sensor has a relatively high value of the oxygen density in the film ranging between 15 and 30 at. %. As a result, there can be obtained an extremely high S/N ratio of an amorphous silicon image sensor.

Figure 15:
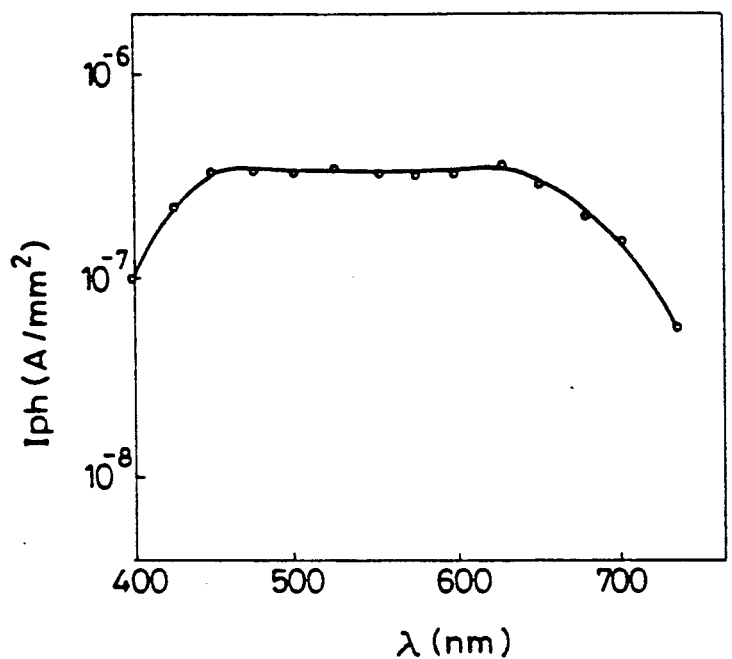
FIG. 15 is a graph showing the characteristic of spectral sensitivity.

FIG. 15 graphically shows one example of the spectral sensitivity characteristic of the present embodiment, in which the abscissa is taken for the wavelength of light in terms of nanometer and the ordinate is taken for the density of photocurrent in terms of A/mm$^2$. In a conventional PIN photovoltaic device (U.S. Pat. No. 4,476,346) including an amorphous silicon mono-layer or at least one kind of oxygen, nitrogen and carbon of a dark resistivity of 10$^8$ ohms-cm formed by a high doping density, photocarriers are converted into an electrical signal only in an amorphous silicon film of 1.7 eV so that it was not possible to obtain a spectral characteristic having a peak at 650 nm. As a result, there were disadvantages, such as difficulty in reading a color image. On the other hand, in the present image sensor, since use is made of a film of high sensitivity and wide optical bandgap as the first amorphous silicon film 23, there is obtained an increase in sensitivity by the first amorphous silicon film 23 in a short wavelength region in the neighborhood of 450 nm as indicated in FIG. 15, so that there is obtained an extremely uniform photocurrent density over the wavelength ranging from 450 nm to 620 nm.

Figure 34:
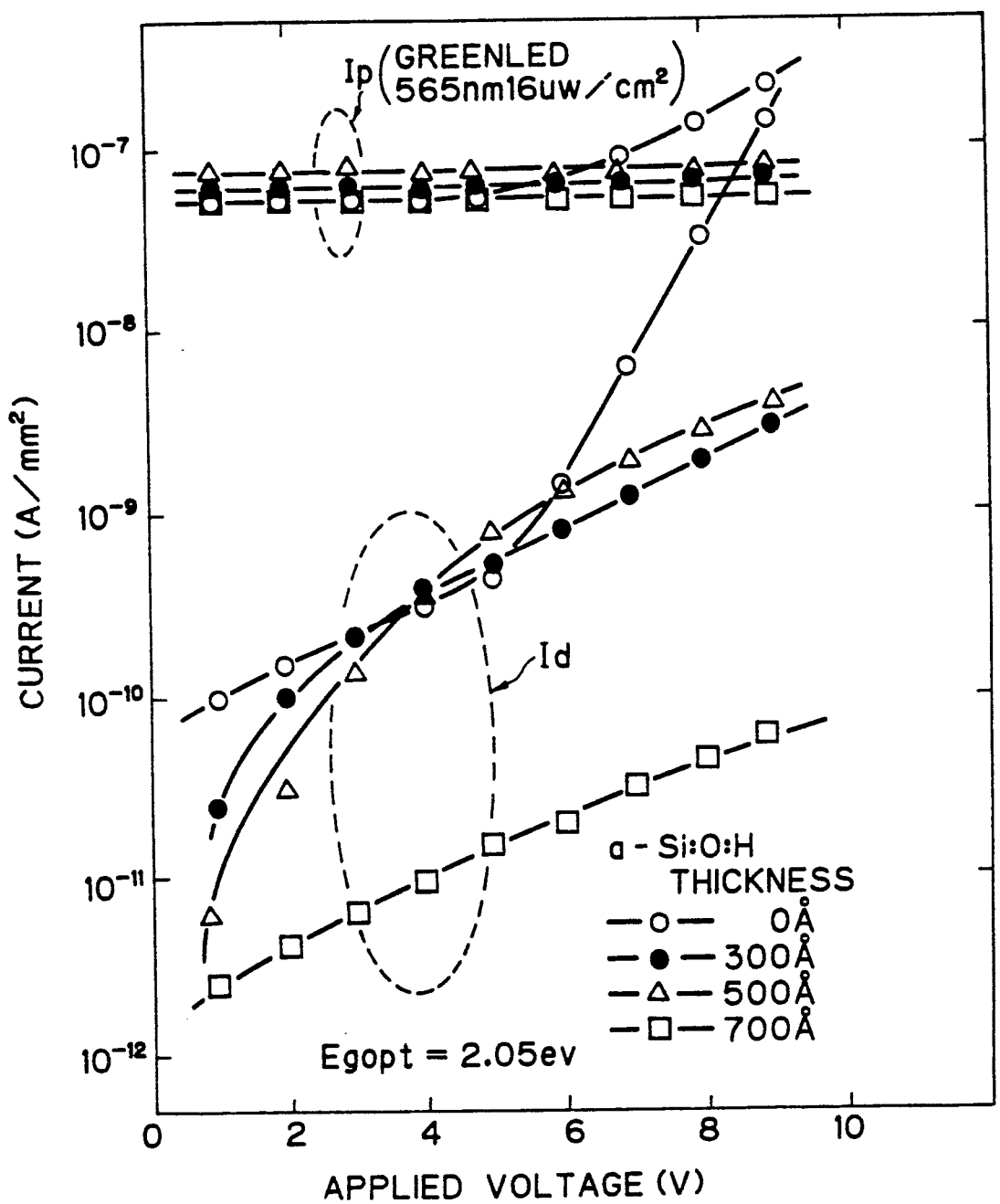
FIG. 34 is a graph showing variations of photocurrent $I_p$ and dark current $I_d$ as a function of applied voltage with the thickness of the amorphous silicon film as a parameter.

In the prior art structure using a film of oxide or nitride, it was necessary to use a thin film of 20 to 100 angstroms thick, and, therefore, it was difficult to provide devices uniform in characteristic. However, in accordance with the present invention, since the resulting device has a very high photoconductive characteristic, the first amorphous silicon film 23 may be made to have the thickness ranging between 200 and 2,000 angstroms, preferably between 300 and 700 angstroms, so that there may be easily provided devices uniform in characteristic. FIG. 34 illustrates variations of photocurrent I$_p$ and dark current I$_d$ as a function of applied voltage with the thickness of the first amorphous silicon film 23 of the present image sensor as a parameter. The optical bandgap of the first amorphous silicon film 23 is 2.05 eV and its dark resistivity is 9×10$^{12}$ ohms-cm. Without the first amorphous silicon film 23, the dark current I$_d$ rapidly increases at around 5 V, which indicates the fact that the injection of carriers from the electrode is not prevented. Although not shown in this figure, this phenomenon has been confirmed to be present until the thickness of the first amorphous silicon film 23 reaches 200 angstroms. As the film thickness increases from 300 angstroms to 700 angstroms, the dark current of the present image sensor decreases and a high S/N ratio is obtained. However, if the thickness of the first amorphous silicon film 23 increases still further, the dark current further decreases; however, it has been confirmed that the photocurrent also tends to decrease at or above the film thickness of 2,000 angstroms. Thus, when taking dark current I$_d$ and photocurrent I$_p$ into consideration, the preferred range of the film thickness is between 300 angstroms and 700 angstroms. It is to be noted that in forming an amorphous silicon film, use may be made of the sputtering method other than the glow discharge method. Moreover, as a source gas, a gas, such as SiH$_4$, Si$_2$H$_6$, SiP$_4$, Si$_2$P$_6$, SiF$_4$, and SiCl$_4$, which is diluted or not diluted by hydrogen, helium, or argon, may be used. As an additive gas for introducing oxygen atoms into the amorphous silicon film, use may be preferably made of such a gas as CO, CO$_2$, NO, N$_2$O, and NO$_2$, which produces oxygen as being decomposed by glow discharge. Selection of these gases is made under the condition that it should not directly react with SiH$_4$ gas or the like. For example, when consideration a reaction between CO$_2$ and SiH$_4$, when these gases come to a glow discharge region, the decomposition proceeds as CO$_2$→CO+O and SiH$_4$→Si+2H$_2$, whereby oxygen and silicon atoms react on the substrate to thereby produce the (O$_3$)-SiH structure. For this purpose, the conditions of RF power of 20 to 50 mW/cm$^2$, substrate temperature of 200 to 275° C., flow rate ratio of CO$_2$/SiH$_4$ of 2.5 to 17.5 and pressure of 1 Torr are required. If the RF power is set at 75 mW/cm$^2$ or more, the decomposition further proceeds to CO→C+O so that oxygen and carbon are now present in the film. In view of the fact of presence of these elements, use may be made of CO gas. In the case where both oxygen and nitrogen are present, NO gas is most preferred.

As described previously, the dark current I$_d$ of the present image sensor may be lowered by increasing the resistivity of the first amorphous silicon film 23. However, if the dark resistivity of the first amorphous silicon film 23 is set in the order of 10$^{14}$ ohms-cm, the photocurrent of the image sensor decreases slightly. In order to prevent such a reduction of photocurrent, a group II impurity, such as B$_2$H$_6$, may be added as a means for increasing the resistivity. The first amorphous silicon film 23 has N conductivity type. Accordingly, when a minute amount (0.01–10 ppm) of a group III impurity is added, it approaches the nature of an intrinsic semiconductor, and, if it is added more, it changes to a P conductivity type semiconductor. As it approaches the nature of an intrinsic semiconductor, the dark resistivity increases. By utilizing this phenomenon, a high resistivity has been obtained without reducing the high photosensitivity. As one manufacturing method, with the flow rate ratio of $CO_2/SiH_4$ at 2.5, the flow rate ratio of $B_2H_6/SiH_4$ at $10^{-7}$, RF power at 21.5 mW/cm$^2$, substrate temperature at 250° C. and pressure at 1 Torr, the first amorphous silicon film 23 was manufactured by a glow discharge decomposition method. The resulting film 23 had a dark resistivity of $2\times10^{14}$ ohms-cm and the resistivity at the time of irradiation of light was $2\times10^6$ ohms-cm. And, when the resulting film was used in the present image sensor, there was obtained the photocurrent of $8.5\times10^{-8}$ A/mm$^2$ and the dark current of $2.0\times10^{-11}$ A/mm$^2$ at applied voltage of 5 V. With the addition of a minute amount of an impurity, there was obtained an image sensor having a high S/N ratio.

If the first electrode 22 is desired to define a Schottky junction and allows transmission of light therethrough, use may be made, for example, of an extremely thin metal film of Pt, Au, or the like, or of silicide, such as PtSi. On the other hand, when a hetero-junction is desired, use may be made of such a material as ITO, SnO$_2$, or the like. In the case where use is made of a transparent, electrically conductive film, such as ITO or SnO$_2$, for forming the first electrode 22, there is a possibility that the film of ITO or the like is reduced during glow discharge decomposition of SiH$_4$, thereby causing a deterioration of performance. However, in the case of a mixture gas of SiH$_4$ and CO$_2$, since oxygen is present during glow discharge, the reduction of the film of ITO or the like is suppressed so that no deterioration of performance takes place.

As an alternative, a metal film is deposited on a metal or electrically insulating substrate, thereby using the deposited metal film as the second electrode having a high reflectance, and, then, the amorphous silicon films 24 and 23 are formed on top of another in the order mentioned, which is followed by the step of forming the first electrode 22 thereon. It should also be noted that an intermediate film identical to the first amorphous silicon film 23 may be provided as sandwiched between the second amorphous silicon film 24 and the second electrode 25 in the structure shown in FIG. 12.

As described above, in accordance with this aspect of the present invention, there is provided an amorphous silicon photoelectric device, typically image sensor, suitable for high speed and high density applications, extremely large in S/N ratio, and uniform in characteristic.

It will now be described as to another embodiment of this aspect of the present invention in detail below. In accordance with this embodiment, there is provided an amorphous silicon image sensor including a pair of first and second electrodes and a multi-layered amorphous silicon body sandwiched between the pair of first and second electrodes, wherein the amorphous silicon body includes a first layer contiguous to the first electrode, containing oxygen and carbon atoms, and having the resistivity ranging between $10^{12}$ and $10^{15}$ ohms-cm and exhibiting photoconductivity with the optical bandgap at 2.0 eV or more. It is to be noted that this embodiment is basically the same in structure as the embodiment described immediately above excepting the fact that the first layer of the amorphous silicon structure or body contains not only oxygen atoms, but also carbon atoms.

Thus, as compared with an amorphous silicon layer containing only oxygen atoms, an amorphous silicon layer containing carbon atoms as well as oxygen atoms has an enhanced heat-resistant characteristic, so that it allows to provide an amorphous silicon image sensor high in durability.

FIG. 16 graphically shows how the optical bandgap and the light and dark conductivities, when irradiated with pseudo sunlight of AMI 100 mW/cm$^2$, of the first amorphous silicon film 23 vary as a function of the flow rate ratio of $CO_2/SiH_4$ in the case where use ia made of a mixture gas of $CO_2$ and $SiH_4$ in order to add oxygen and carbon atoms into the film 23. The present embodiment exhibits the hydrogen release and infrared light absorption characteristics as indicated in the graphs of FIGS. 8 and 9, respectively. Thus, the description with respect to these figures holds also true for the present embodiment. FIG. 15 graphically shows one example of the spectral sensitivity characteristic of the present image sensor. As shown, there is obtained an extremely uniform photocurrent density over a broad range of wavelength of light between 450 and 620 nanometers.

As an additive gas for introducing oxygen and carbon atoms into an amorphous silicon film, instead of SiH$_4$ which reacts with a silicon material directly, use is preferably made of a compound of oxygen and carbon, such as CO or CO$_2$, or a compound of oxygen, carbon, and hydrogen, as long as it decomposes due to energy of glow discharge or the like, thereby producing oxygen and carbon atoms. The method of introducing oxygen and carbon atoms into the film can be carried out, for example, by increasing the decomposition energy of glow discharge or the like to the extent that the property of the amorphous silicon film is not deteriorated significantly. In addition, an amorphous silicon film, in general, has an n$^-$ conductivity type, but it may be converted to be intrinsic or near intrinsic by doping with a group III atom, such as B$_2$H$_6$. It should also be noted that the second electrode 25 may be comprised of a metal, such as Al, NiCr, Cr, Mo, W, Ag, or Ti, or it may have a dual-layer structure including polysilicon and microcrystalline silicon.

If desired, a light-shielding mask, for example, of Cr or the like may be provided at the light incident side of the image sensor shown in FIG. 12, in which case the degree of resolution is further refined. In the above-described embodiment of this aspect of the present invention, only that portion of the amorphous silicon body which is in contact with the first electrode contains oxygen and carbon atoms; however, as an alternative structure, that portion of the amorphous silicon body which is in contact with the second electrode may also contain oxygen and carbon atoms. In this case, both types of carriers, i.e., electrons and holes, are prevented from being injected into the amorphous silicon body under dark condition.

It will now be described as to a further embodiment of this aspect of the present invention in detail below. In accordance with this embodiment, there is provided an amorphous silicon image sensor including a pair of first and second electrodes and a multi-layered amorphous silicon body sandwiched between the pair of first and second electrodes, wherein the amorphous silicon body includes a first layer contiguous to the first electrode, containing oxygen and nitrogen atoms or oxygen, carbon and nitrogen atoms, and having the resistivity ranging between $10^{12}$ and $10^{15}$ ohms-cm and exhibiting photoconductivity with the optical bandgap at 2.0 eV or more. It is to be noted that this embodiment is basically the same in structure as the embodiments described above excepting the fact that the first layer of the amorphous silicon structure or body contains not only oxygen atoms, but also nitrogen atoms, with or without carbon atoms.

With this structure of the present embodiment, the charge injection from the first electrode under dark condition is prevented from taking place by the extremely high resistivity ranging between $10^{12}$ and $10^{15}$ ohms-cm possessed by the first amorphous silicon layer which is in contact with the first electrode; whereas, since the first amorphous silicon layer has a photoconductive characteristic, the carriers produced by illumination may pass through the first amorphous silicon layer, so that an extremely high light and dark contrast or S/N ratio can be obtained. In addition, since the first amorphous silicon layer has a photoconductive characteristic, its film thickness can be set 5 to 10 times larger as compared with a prior art electrically insulating film using an oxide or nitride, so that the present invention allows to provide devices uniform in characteristic. Moreover, the first amorphous silicon layer can vary its optical bandgap up to the level of 2.0 to 3.0 eV and has a photoconductive characteristic, so that the sensitivity to light of shorter wavelengths absorbable by this optical bandgap can be enhanced. Furthermore, in combination with an undoped amorphous silicon layer, the light sensitivity of an amorphous silicon image sensor may be made flat, which is advantageous in the color facsimile application.

In general, in the case where use is made of a transparent, electrically conductive film, such as ITO or $SnO_2$, for the electrode, if the glow discharge decomposition of $SiH_4$ is carried out for forming an amorphous silicon layer by deposition, the oxygen contained in the ITO or $SnO_2$ material is reduced, thereby causing a deterioration of the transparent, electrically conductive film or causing a deterioration due to changes of the state at the interface with the amorphous silicon film. However, if use is made of a mixture gas including $SiH_4$ and a gas which produces oxygen atoms due to glow discharge decomposition, the oxygen atoms thus produced will help surpressing the reduction of ITO or $SnO_2$ so that no deterioration will be brought about. Furthermore, as compared with an amorphous silicon film containing only oxygen atoms, an amorphous silicon film containing not only oxygen atoms, but also nitrogen atoms, with or without carbon atoms, is reduced in the number of dangling bonds, so that the film has an enhanced quality, especially in heat-resistance and durability.

Next, a specific example for manufacturing a photoelectric device in accordance with this embodiment of the present invention will be described in detail below. In the first place, on the transparent glass substrate 21 is formed by vacuum deposition a film of ITO to the thickness of 800 angstroms, which is then selectively removed photolithographically to define the first (individual) electrode 22. In the case of application to an image sensor for use in a facsimile machine, it is preferably so structured that there are 8 or 16 individual electrodes 22 per millimeter. This substrate is then placed in a CVD apparatus in which a mixture gas of $SiH_4$, $CO_2$, and $N_2$ is introduced, whereby the first amorphous silicon layer 23 is formed to the thickness of 400 angstroms by the glow discharge decomposition at a relatively low RF power of 23.5 mW/cm$^2$. At this time, the pressure is preferably set at 1.0 Torr and the substrate temperature is set at 250° C., while using a SUS mask. Then, $SiH_4$ is introduced and the second undoped amorphous silicon layer 24 is formed to the thickness of 1.5 microns by the glow discharge decomposition. The conditions, such as pressure condition, in this step are identical to those for the formation of the first amorphous silicon layer 23. Finally, using a SUS mask, an Al film is formed by vacuum deposition, and, then, it is patterned to define the second (common) electrode 25. This patterning may be carried out either using a mask or first forming a film across the entire surface and then removing the film selectively by a photolithographic technique.

Figure 17:
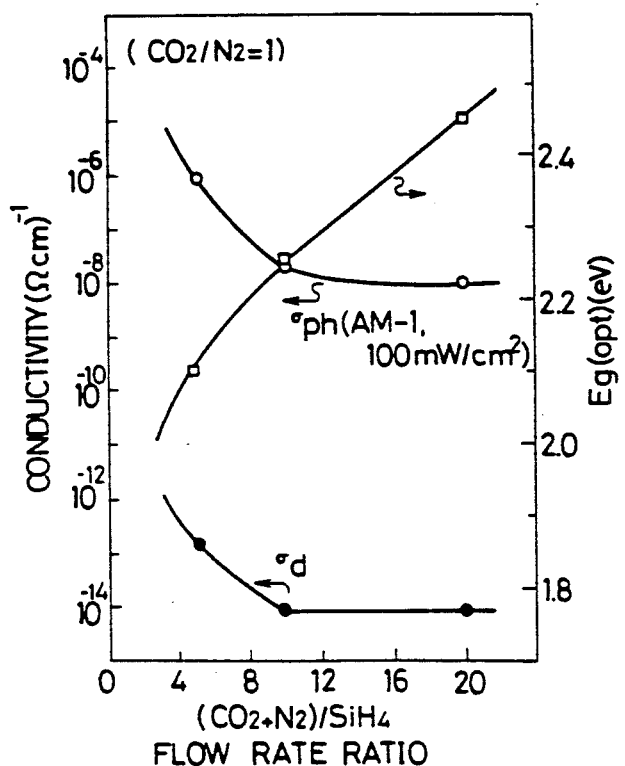
FIG. 17 is a graph showing the relation between the gas flow rate ratio of $(CO_2+N_2)/SiH_4$ and the optical band gap or light and dark conductivities for an a-Si film added with oxygen and nitrogen atoms.

FIG. 17 graphically shows how the optical bandgap, the light conductivity under illumination of AMI (pseudo sunlight) 100 mW/cm$^2$, and the dark conductivity of the first amorphous silicon layer 23, which is formed at low RF power using a mixture gas of $CO_2$ and $N_2$ in order to introduce oxygen and nitrogen atoms into the film 23, vary as a function of the gas flow rate ratio of $(CO_2+N_2)/SiH_4$. As shown, as $(CO_2+N_2)/SiH_4$ increases, the optical bandgap broadens. On the other hand, light conductivity decreases gradually up to $(CO_2+N_2)/SiH_4=10$ and then it finally levels off toward $10^{-8}$ ohms-cm$^{-1}$. The dark conductivity decreases from $10^{-12}$ to $10^{-14}$ ohms-cm$^{-1}$ up to $(CO_2+N_2)/SiH_4=10$, and, then, it levels off toward the value of $10^{-15}$ ohms-cm$^{-1}$. It is to be noted that the flow rate ratio of $CO_2/N_2$ is set to be unity. It is thus clear that the present embodiment also allows to provide an extremely high S/N ratio. Because of the fact that the present embodiment has an extremely high photoconductive characteristic, the first amorphous silicon layer 3 may be formed to have the thickness ranging between 200 and 2,000 angstroms, preferably between 300 and 700 angstroms, so that there can be provided devices all uniform in characteristic. In addition, since the amorphous silicon layer can be made larger in thickness, even if pin holes are produced in the second amorphous silicon layer 24, the first amorphous silicon layer 23 will prevent the occurrence of short-circuiting between the electrodes 22 and 25 or of dielectric breakdown at the time of application of a bias voltage.

If use is made of the glow discharge method, the first amorphous silicon layer 23 may be formed using $SiH_4$ and a mixture gas of $CO_2$ and $N_2$. In order to introduce oxygen and nitrogen atoms into the first amorphous silicon layer 23, the layer 23 may be formed at a very low RF power. On the other hand, in order to introduce oxygen, nitrogen, and carbon atoms into the film 23, it can be done simply by increasing the RF power to the extent that the quality of the film 23 is not deteriorated. Here, $CO_2$ is a source material for the oxygen atoms or oxygen and carbon materials in the film, and $N_2$ is a source material for the nitrogen atoms in the film. If $CO_2$ and $N_2$ are used at the same time, oxygen atoms or oxygen and carbon atoms are more effectively introduced into the film as compared with the case using $CO_2$ alone, so that the optical bandgap can be broadened more easily and the introduction of nitrogen atoms increases the degree of minuteness, thereby enhancing the blocking effect against charge injection under dark condition. The introduction of nitrogen and carbon atoms into the film causes the peak of hydrogen release characteristic curve at the time of heat treatment to be shifted toward higher temperature, so that there will be provided an enhanced heat-resistant characteristic.

Figure 18:
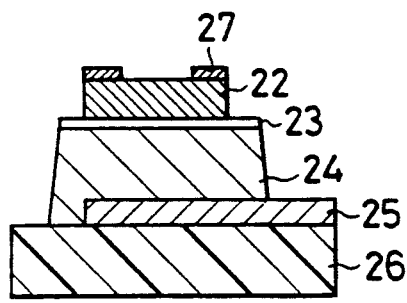
FIG. 18 is a schematic, cross-sectional view showing an amorphous silicon photoelectric device modified from the device shown in FIG. 12.

FIG. 18 schematically shows in cross section a further embodiment of this aspect of the present invention, which is so structured that light is incident at the side opposite to the side where the substrate is provided. As shown, the present device includes an electrically insulating substrate 26, such as ceramic, glass or a metal plate having formed on one surface thereof an insulating film of $SiO_2$, $Al_2O_3$, or the like. On this substrate 26 is first formed a film of Cr or NiCr across its entire surface by deposition or sputtering, and, then, the film is selectively removed by a photolithographic technique to define the second or individual electrode 25. Then, an undoped amorphous silicon film 24 is formed to the thickness of 1.5 microns by the glow discharge decomposition using $SiH_4$ gas on the substrate 26 and the electrode 25. Then, another amorphous silicon film 23 containing oxygen, nitrogen, and carbon atoms is formed to the thickness of 400 angstroms by the glow discharge decomposition at a relatively high RF power of 100 mW/cm$^2$ using a mixture gas of $SiH_4$ and $CO_2+N_2$. Patterning of these amorphous silicon films 23 and 24 may be carried out either using a mask or using a photolithographic technique. Then, as a first electrode 22, a transparent, electrically conductive film of ITO or $SnO_2$ is formed to the thickness of 800 angstroms. Finally, as a light-shielding mask 27, a metal thin film is formed from Cr or the like to provide a sensor structure. An opening defined by the light-shielding mask 27 is preferably set, for example, to have the width of 100 microns for the resolution of 8/mm. The resulting amorphous silicon image sensor has been found to possess an extremely high light and dark contrast or S/N ratio, whose device characteristic is comparable to that obtained in the structure shown in FIG. 12.

As an additive gas for adding oxygen, nitrogen, and carbon atoms into an amorphous silicon film, use may be made of any gas which decomposes due to the energy of glow discharge or the like to produce oxygen, nitrogen, and carbon atoms other than those gases, such as $SiH_4$, which directly reacts with a silicon material. In the case of introducing oxygen and carbon atoms, use may be made of CO, $CO_2$, or a compound of oxygen, carbon, and hydrogen; whereas, in the case of introducing nitrogen atoms, use may be made of $N_2$ or $NH_3$. If only oxygen and nitrogen atoms are desired to be introduced, a gas including oxygen and nitrogen atoms, such as NO or $N_2O$, may be preferably used. If it is desired to further increase the resistivity of the amorphous silicon film, a minute amount of group III element may be added using a gas, such as $B_2H_6$.

Figure 19:
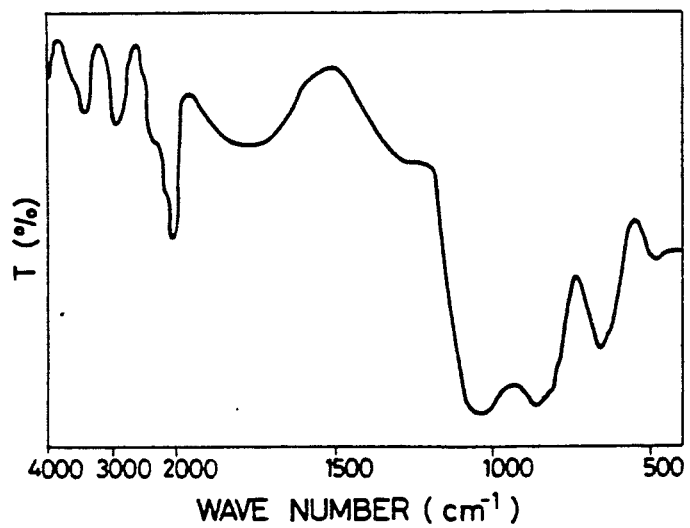
FIG. 19 is a graph showing the characteristic of infrared light absorption.
Figure 20:
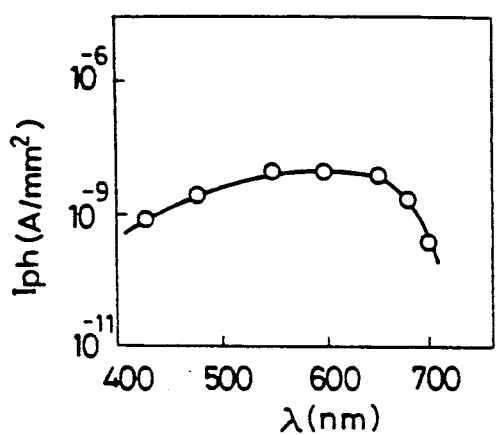
FIG. 20 is a graph showing the characteristic of spectral sensitivity.

FIG. 19 graphically shows the infrared absorption characteristic of an amorphous silicon film formed at low RF power using $CO_2$ and $N_2$. In the graph of FIG. 19, the abscissa is taken for the wave number and the ordinate is taken for the transmission rate. From this graph, the presence of oxygen and nitrogen atoms can be seen. On the other hand, the presence of carbon atoms in the film has also been determined by other analytical technique. FIG. 20 graphically shows one example of the spectral sensitivity of the amorphous silicon film, in which the abscissa is taken for the wavelength of light and the ordinate is taken for the photocurrent density in terms of A/mm$^2$. As different from the characteristic for the case in which only undoped amorphous silicon films are used, the sensitivity of the present amorphous silicon film is enhanced at a shorter wavelength region, and the overall spectral sensitivity is generally flat. In order to make the sensitivity characteristic even more flat, it is only necessary to form a plurality of amorphous silicon films, each containing oxygen and nitrogen atoms or containing oxygen, nitrogen, and carbon atoms, one on top of another as the first amorphous silicon layer 22.

Now, a still further aspect of the present invention will be described in detail hereinbelow. This aspect of the present invention is particularly directed to an enhancement of sensitivity to light of short wavelength in an amorphous silicon photoelectric device.

As described previously, there are basically two types of photoelectric devices using amorphous silicon, i.e., sandwich type and coplanar type. For high speed applications, sandwich type photoelectric device, in which a pair of electrodes sandwiches a body of amorphous silicon, are commonly used.

In general, amorphous silicon hydride or a-Si:H, to which no impurity is added, for use in a photoelectric device has an optical bandgap of approximately 1.7 eV. For this reason, the spectral sensitivity of a-Si:H has a peak in the vicinity of 600 nanometers. For the purpose of utilizing the light of shorter wavelength shorter than 600 nanometers, it is known to dope a-Si:H with carbon atoms, thereby providing a-Si:C:H, which has a broadened optical bandgap ranging between 1.9 and 2.4 eV. In this connection, reference is made to the following articles. D. A. Anderson and W. E. Spear, "Electrical And Optical Properties of Amorphous Silicon Carbide, Silicon Nitride And Germanium Carbide Prepared By The Glow Discharge Technique", Philos. Mag., 35:1(1977), and R. S. Sussmann and R. Ogden, "Photoluminescence And Optical Properties Of Plasama-deposited Amorphous $Si_xC_{1-x}$ Alloys", Philos. Mag. B, 44:137(1981).

However, a-Si:C:H is abundant in dangling bonds as compared wtih a-Si:H and has a high local state density. For this reason, in dark conductivity, a-Si:C:H tends to have hopping conduction other than activation type conduction and it is difficult to obtain a large ratio between light and dark conductivities. This fact can be detrimental in the function of a photoelectric device. Moreover, in the case of using a transparent, electrically conductive film, such as ITO or $SnO_2$, as an electrode of the photoelectric device, a source material of carbon atoms, such as $CH_4$, for a-Si:C:H reduces the oxygen atoms of ITO or $SnO_2$ to produce SiO, $SiO_2$, Sn, or In, which then penetrates into the film of a-Si:C:H, thereby causing a deterioration of photoelectric conversion characteristic.

This aspect of the present invention has been developed to solve such a problem as described above by providing a photoelectric device including a pair of electrodes and a single amorphous silicon layer which contains at least one of hydrogen, halogen, and heavy hydrogen atoms, whereby oxygen atoms produced by glow discharge decomposition are added to the a-Si layer at the time of formation thereof. With the introduction of oxygen atoms, there is obtained an a-Si layer having a small local state density and exhibiting a photoconductive characteristic with the optical bandgap at 2.0 eV or more. In addition, the ratio between the light and dark conductivities, i.e., $sigam_{ph}/sigma_d$, is very high and $10^3$ or more.

Figure 21:
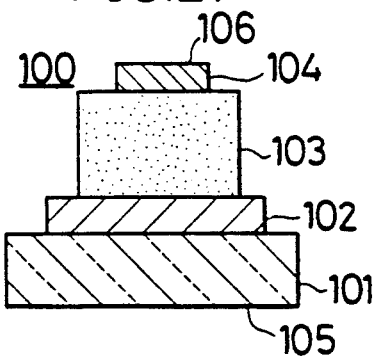
FIGS. 21 and 22 are schematic, cross-sectional views showing amorphous silicon photoelectric devices having a single-layered amorphous silicon structure constructed in accordance with further embodiments of the present invention.
Figure 22:
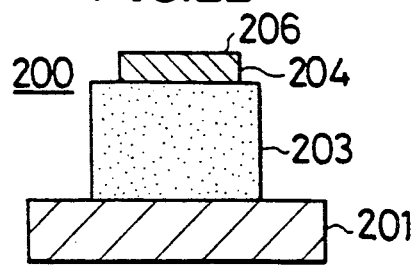

Two typical examples constructed in accordance with one embodiment of this aspect of the present invention are illustrated in FIGS. 21 and 22. An a-Si photoelectric device 100 shown in FIG. 21 includes a transparent substrate 101 of glass or transparent high polymer film, one surface of which is provided with a bottom electrode 102, on which is formed an a-Si layer 103 having formed thereon a top electrode 104. In this type of photoelectric device, as a light incident surface, either the other surface 105 of the transparent substrate 101 or a top surface 106 of the top electrode 104 may be selected. In a photoelectric device 200 shown in FIG. 22, use is made of an opaque substrate 201 comprised of a metal substrate of Al, Fe, Ni, or Cr, or a ceramic substrate having one surface treated to exhibit electrical conductivity, and an a-Si layer 203 is formed on the substrate 201, with a top electrode 204 being formed on the a-Si layer 203. In this type, the opaque substrate 201 also serves as a bottom electrode. Thus, the light incident surface in this case is limited only to the surface 206 of the top electrode 204.

Figure 23:
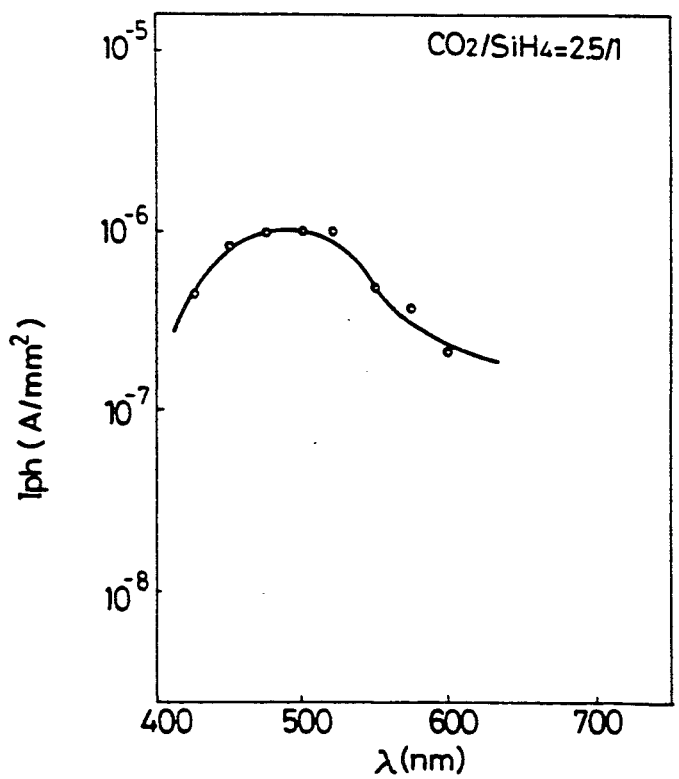
FIG. 23 is a graph showing the characteristic of spectral sensitivity.

The a-Si layer $10^3$ or 203 of the photoelectric device 100 or 200 has a-Si as its matrix material and it also contains at least one of hydrogen, halogen, and heavy hydrogen atoms and contains additionally oxygen atoms. This a-Si layer is formed by the glow discharge decomposition of a hydride, heavy hydride, or halide of silicon and $CO_2$. The a-Si film thus formed has a capability to exhibit a significant photoconductive characteristic with the optical bandgap at 2.0 eV or more. As described previously, the presence of oxygen atoms in the a-Si layer can be determined by measuring infrared absorption by this a-Si layer. FIG. 23 graphically shows the spectral sensitivity characteristic of the a-Si layer $10^3$ or 203. From the graph of FIG. 23, it can be seen that the a-Si layer has a peak of sensitivity to light in the vicinity of 500 nanometers, which indicates the effect of enhancement of sensitivity to light of short wavelength.

The light conductivity $sigma_{ph}$ when illuminated with AMI (pseudo sunlight) of 100 mW/cm$^2$ vary between $10^{-6}$ and $10^{-9}$ ohms-cm$^{-1}$ depending on the amount of $CO_2$ added in a region where the optical bandgap is 2.0 eV or more. On the other hand, the dark conductivity $sigma_d$ takes the value ranging between $10^{-12}$ and $10^{-15}$ ohms-cm$^{-1}$ in the above-mentioned amount of $CO_2$, so that the ratio of the light conductivity to the dark conductivity, i.e., $sigma_{ph}/sigma_d$, takes the value larger than $10^3$, which indicates that the value of $sigma_{ph}/sigma_d$ is very high. This is considered to result from the fact that an a-Si layer having a small local state density can be fabricated by using $CO_2$ as an oxygen source for the a-Si layer.

It is to be noted that the a-Si layer 103 or 203 may be used as a p type or n type photoelectric device by doping it with a group III element or a group V element. The preferred group III element for doping may be selected from the group including B, Al, Ga, In, and Tl; on the other hand, the preferred group V element for doping may be selected from the group including P, As, Sb and Bi. The preferred amount of doping in this case is normally set in a range between $10^{-6}$ and $10^{-2}$ atomic %. As a method for doping the a-Si layer with an impurity, at the time of carrying out the glow discharge decomposition using a hydride, heavy hydride, or halide of silicon and $CO_2$, a hydride, heavy hydride, or halide of a group III or V element, such as $B_2H_6$, $B_2D_6$, $BF_3$, $PH_3$, $PD_3$, or $PF_3$, is introduced into a reaction chamber. The amount of impurity to be added is controlled by controlling the amount of gas, such as a hydride, heavy hydride, or halide of an impurity to be introduced into the reaction chamber. The thickness of the a-Si layer 103 or 203 is determined, for example, by the wavelength of light used, and it is normally in a range between 0.1 and 5 microns, preferably between 0.3 and 2.0 microns.

In the structure of the photoelectric device 100, either the surface 105 of the transparent substrate 101 or the surface 106 of the top electrode 104 may be selected as a light incident surface. In the case where light is incident upon the surface 105 of the transparent substrate 101, it is preferable to provide a Schottky junction at the interface between the bottom electrode 102 and the a-Si layer 103. In this case, the bottom electrode 102 is formed by deposition or sputtering of a metal, such as Pt, Au, or Pd. In consideration of light transmission, the bottom electrode 102 is normally 50 to 300 angstroms thick, preferably 50 to 100 angstroms thick. Instead of providing a Schottky junction at the interface between the bottom electrode 102 and the a-Si layer 103, there may be provided a hetero-junction using a transparent, electrically conductive film of ITO or $SnO_2$. In the case of using a transparent, electrically conductive film, since oxygen atoms are contained in the a-Si layer 103, SiO and $SiO_2$ are prevented from being formed at the interface between the transparent, electrically conductive film and the a-Si layer and the diffusion of In into the a-Si layer is suppressed, so that no deterioration of photoelectric conversion characteristic, as seen in the case of a-Si:C:H, takes place.

The top electrode 104 is preferably comprised of a film of metal, such as Al, Ni, or Cr. Such a metal film may be preferably formed by vapor-deposition or sputtering. In the case where light is incident into the photoelectric device 100 through the surface 106 of the top electrode 104, the bottom electrode 102 is formed from a film of metal, such as Al, and, as the top electrode 104, use may be preferably made of a thin film of metal, such as Pt, for forming a Schottky junction or of a transparent, electrically conductive film of ITO or the like for forming a hetero-junction. Furthermore, in the case of the photoelectric device 200, light is incident into the device only through the surface 206 of the top electrode 204, so that, in consideration of light transmission, the top electrode 204 is preferred to be comprised of a metal thin film, which defines a Schottky junction or a hetero-junction, or a transparent, electrically conductive film.

Now, specific examples will be provided to help understand this aspect of the present invention more accurately.

EXAMPLE 1

On a glass substrate (25 mm × 50 mm, t = 1.0 mm) was formed a film of ITO as a bottom electrode, and a-Si:O:H containing oxygen atoms was deposited thereon to the thickness of approximately 5,000 angstroms. The conditions for manufacturing the a-Si layer were as follows:

| Method: | Plasma CVD method | | |
|---|---|---|---|
| Source gas: | SiH$_4$ in H$_2$ | 10% | 100 sccm |
| | CO$_2$ | 100% | 25–100 sccm |
| Substrate temp.: | 250° C. | | |
| Pressure inside reaction chamber: | 1.0 Torr | | |
| RF output: | 2 W | | |

On the a-Si layer was formed a film of Al as a top electrode by deposition.

Figure 24:
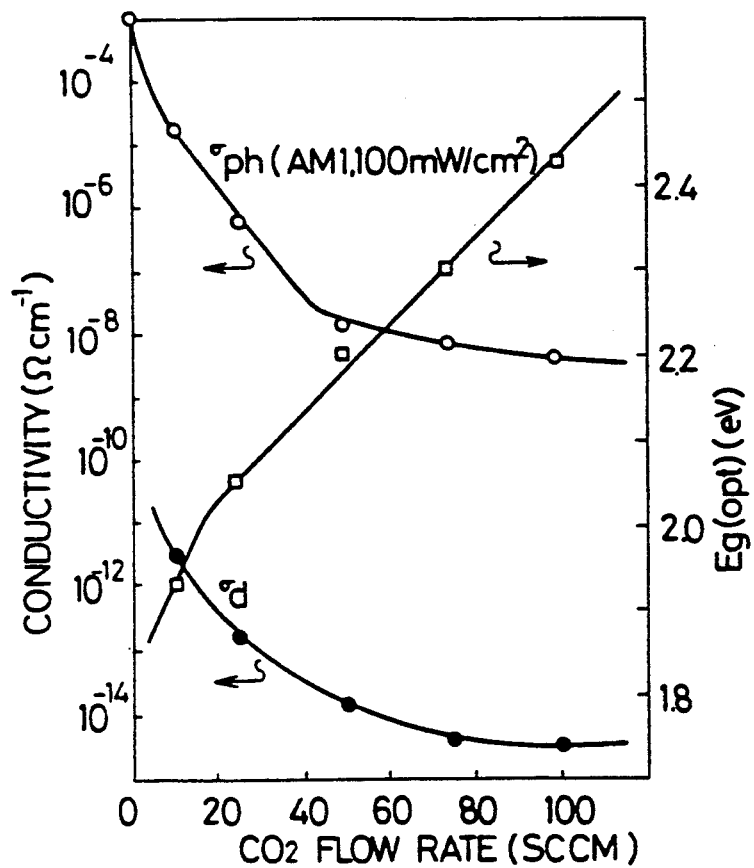
FIG. 24 is a graph showing the relation between the added gas flow rate for adding oxygen atoms to a film of a-Si:O:H and the optical band gap or light and dark conductivities.

FIG. 24 graphically shows the optical bandgap and the light and dark conductivities of the a-Si:O:H layer in the photoelectric device thus manufactured. As shown, the optical bandgap is in a range between 2.0 and 2.43 eV. And, the light conductivity signam$_{ph}$ uder illumination of AM1 (pseudo sunlight) 100 mW/cm$^2$ from the side of the transparent substrate decreases from $10^{-6}$ to $10^{-8}$ ohms-cm$^{-1}$ as the added amount of $CO_2$ increases. On the other hand, the dark conductivity sigma$_d$ of this a-Si:P:H layer is in a range between $10^{-12}$ and $10^{-15}$ ohms-cm$^{-1}$, so that the ratio of the light conductivity to the dark conductivity, i.e., sigma$_{ph}$/sigma$_d$, has been found to be larger than $10^3$.

EXAMPLE 2

With the structure being identical to that of example 1, the a-Si:O:H layer was doped with group III and V atoms. B and P were selected as doping impurity elements. The conditions for the formation of the a-Si:O:H were as follows:

| Method: | Plasma CVD method | | |
|---|---|---|---|
| Souce gas: | SiH$_4$ in H$_2$ | 10% | 100 sccm |
| | CO$_2$ | 100% | 25 sccm |
| | B$_2$H$_6$ in H$_2$ | 2,000 ppm | 10-150 sccm |
| | PH$_3$ in H$_2$ | 2,000 ppm | 10-250 sccm |

Figure 25:
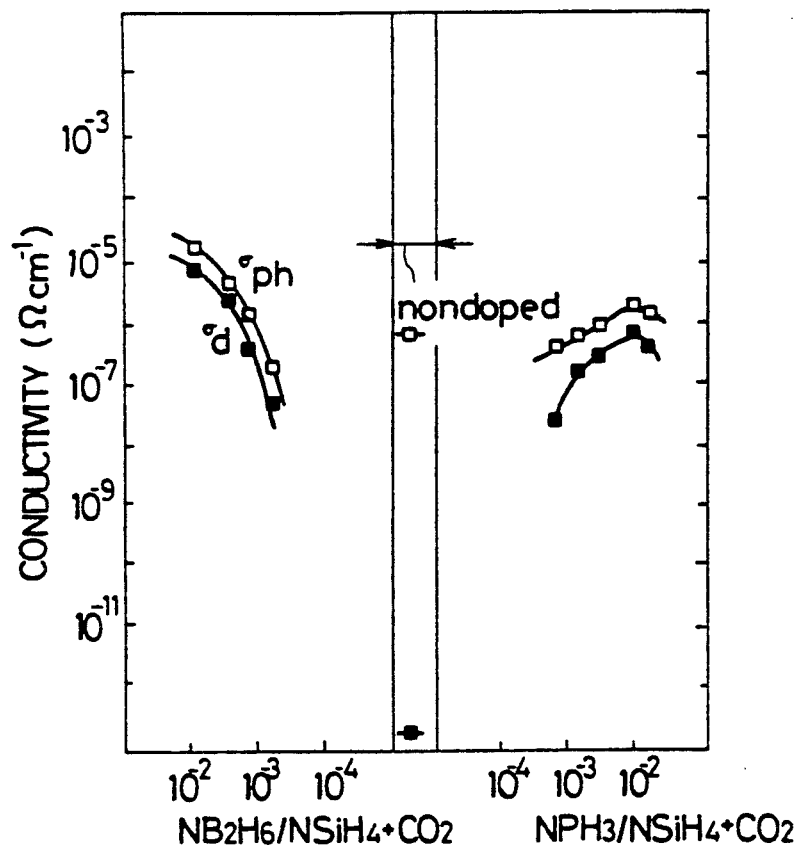
FIG. 25 is a graph showing how the light and dark conductivities vary when the film of a-Si:O:H is doped with group III and V atoms.

FIG. 25 graphically shows the light conductivity under illumination of AM1 (pseudo sunlight) 100 mW/cm$^2$ and the dark conductivity of the a-Si:O:H layer thus formed. As shown, as the amount of a hydride for group III and V additive impurity elements increases, the light and dark conductivities have been found to increase. That is, the a-Si:O:H layer is charge-controllable and a p-n junction may be formed.

EXAMPLE 3

Instead of ITO, Pt was deposited approximately to the thickness of 100 angstroms so as to defined a Schottky junction, and a photoelectric device was fabricated similarly with examples 1 and 2. The similar effects were also found in the present example.

EXAMPLE 4

Instead of SiH$_4$, using a heavy hydride of SiD$_4$ and a halide of SiF$_4$, similar photoelectric devices were manufactured. These devices were also found to produce the similar results.

It will now be described as to another embodiment of this aspect of the present invention in detail below. This embodiment is basically the same in structure as the previously described embodiment excepting the fact that the a-Si layer contains not only oxygen atoms, but also carbon atoms. That is, while heat-treating at high temperature, the hydrogen atoms inside of the a-Si film are normally released, thereby causing a deterioration of the film quality; however, in accordance with the present embodiment, since the oxygen and carbon atoms produced by the glow discharge are introduced into the resulting a-Si film, so that the peak temperature becomes shifted toward higher temperatures as compared with the case of introducing only oxygen atoms, thereby providing an enhanced heat-resistant characteristic. This is because, by introducing carbon atoms to the extend that it does not increase the number of dangling bonds, not only the hydrogen atoms bonded to carbon atoms, but also the hydrogen atoms bonded to Si and oxygen atoms are also stabilized due to the introduction of carbon atoms.

Figure 26:
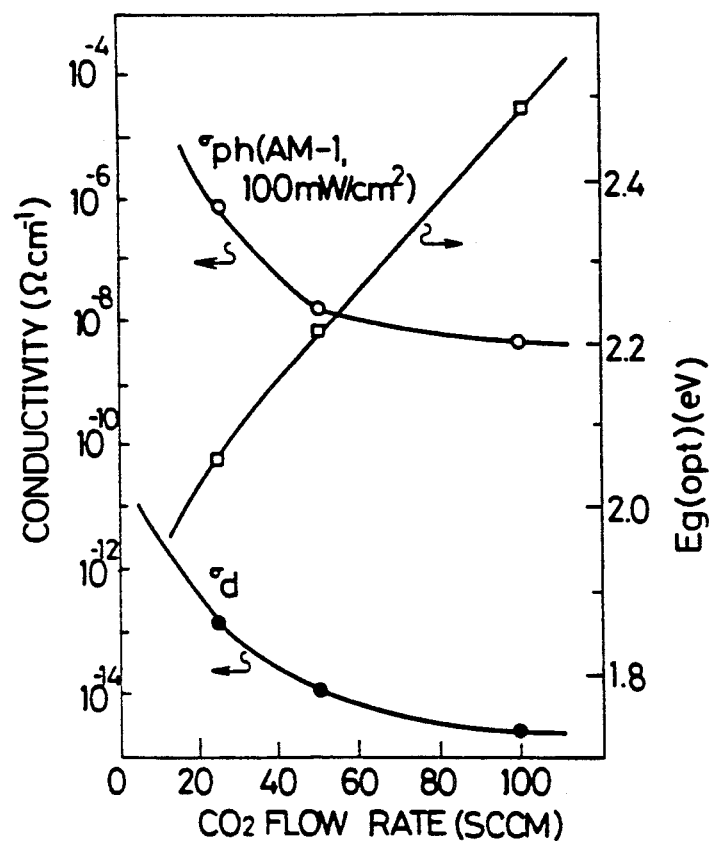
FIG. 26 is a graph showing the relation between the added gas flow rate for adding oxygen and carbon atoms to an a-Si film and the optical band gap or light and dark conductivities.
Figure 27:
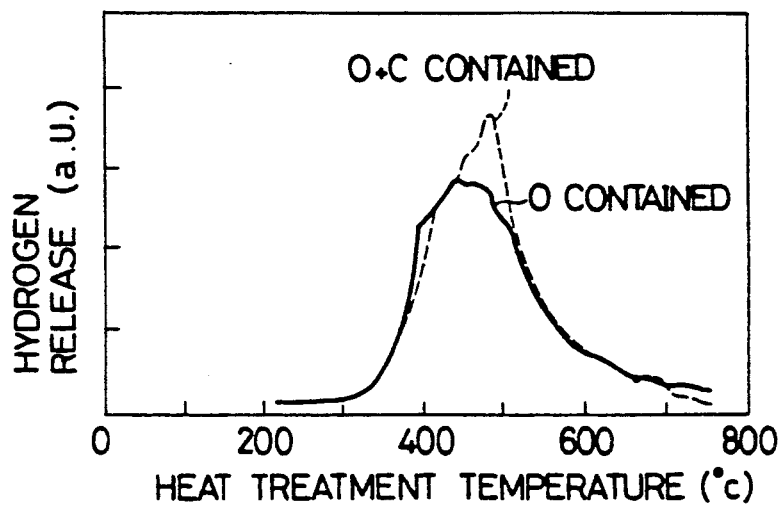
FIG. 27 is a graph showing how hydrogen release takes place when heat treated.

FIG. 26 graphically shows the optical bandgap and the light and dark conductivities of the a-Si layer manufactured using a mixture gas of SiH$_4$ and CO$_2$. FIG. 27 graphically shows the measured results of hydrogen release when the a-Si film containing only oxygen atoms and the a-Si film containing oxygen and carbon atoms have been heat-treated. It is seen that there is a shift in the peak position between the two cases, which indicate that the heat-resistant characteristic is improved by the introduction of carbon atoms into the a-Si film.

Several specific examples according to this embodiment will be given below.

EXAMPLE 1

On a glass substrate (100 mm × 100 mm, t = 1.0 mm) was formed an ITO film to the thickness of 800 angstroms as a bottom electrode, and, while covering a SUS mask provided with an opening of 7 mm × 7 mm, an a-Si layer containing oxygen and carbon atoms was deposited to the thickness of approximately 5,000 angstroms by the glow discharge decomposition. The conditions for fabricating the a-Si layer were as follows:

| Method: | Plasma CVD method | | |
|---|---|---|---|
| Source gas: | SiH$_4$ in H$_2$ | 10% | 100 sccm |
| | CO$_2$ | 100% | 25-100 sccm |
| Substrate temp.: | 250° C. | | |
| Pressure inside of reaction chamber: | 1.0 Torr | | |
| RF output: | 15 W | | |

On the a-Si layer was formed a film of Al to the thickness of approximately 5,000 angstroms by deposition as a top electrode. The resulting device was found to possess the excellent characteristics as described before.

EXAMPLE 2

Instead of ITO, Pt was deposited to the thickness of approximately 100 angstroms so as to define a Schottky junction, and a photoelectric device similar to the above example 1 was manufactured. Similarly with the example 1, excellent results were obtained.

EXAMPLE 3

Instead of SiH$_4$, using a heavy hydride of SiD$_4$ and a halide of SiF$_4$, a similar photoelectric device was manufactured. The resulting device was found to provide excellent characteristics as described before.

It will now be described as to a further embodiment of this aspect of the present invention in detail below. This embodiment is basically the same in structure as the previously described embodiments excepting the fact that the a-Si layer contains not only oxygen atoms, but also nitrogen atoms. That is, with the introduction of oxygen and nitrogen atoms in the a-Si layer, its heat-resistant characteristic is improved, and the introduction of nitrogen atoms allows to form the a-Si layer containing oxygen and nitrogen atoms at lower RF power, which contributes to form the a-Si layer high in quality.

Several specific examples according to this embodiment will be given below.

EXAMPLE 1

On a glass substrate (25 mm × 50 mm, t = 1.0 mm) was formed a film of ITO as a bottom electrode, and a-Si:H:O containing oxygen and nitrogen atoms was deposited thereon to the thickness of approximately 5,000 angstroms by the glow discharge decomposition. The conditions for forming the a-Si layer were as follows:

| Method: | Plasma CVD method | | |
|---|---|---|---|
| Source gas: | $SiH_4$ in $H_2$ | 10% | 100 sccm |
| | $CO_2$ | 100% | 25-100 sccm |
| | $N_2$ | 100% | 25-100 sccm |
| | $CO_2/N_2$ | 1 | |
| Substrate temp.: | 250° C. | | |
| Pressure inside reaction chamber: | 1.0 Torr | | |
| RF output: | 8 W | | |

On the a-Si layer was formed a film of Al by deposition as a top electrode.

Figure 28:
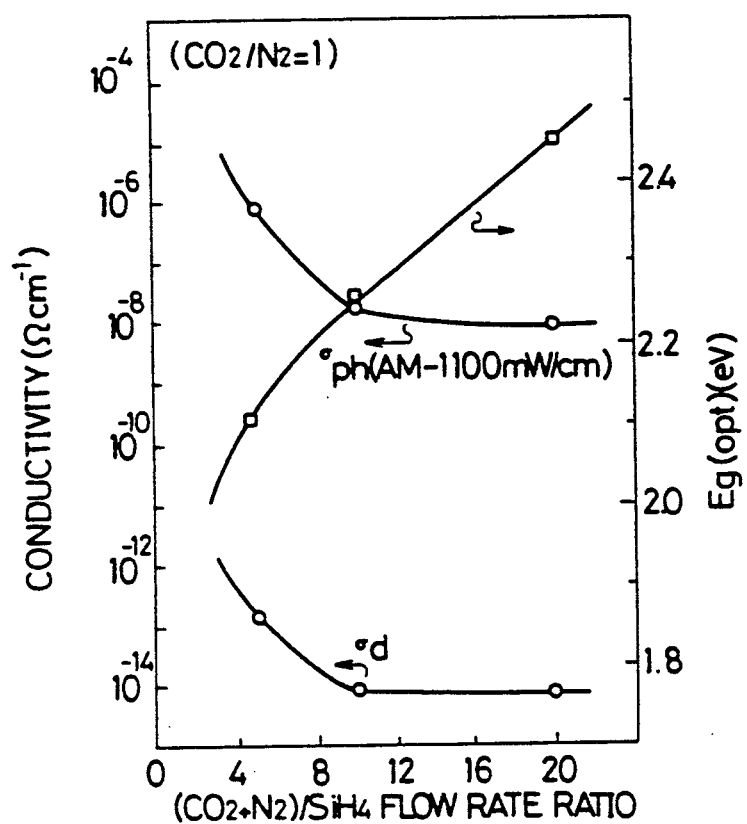
FIG. 28 is a graph showing the relation between the gas flow rate ratio of $(CO_2+H_2)/SiH_4$ for adding oxygen and nitrogen atoms and the optical band gap or light and dark conductivities.

FIG. 28 graphically shows the optical bandgap and the light and dark conductivities of the a-Si layer containing oxygen and nitrogen atoms in the photoelectric device thus manufactured.

EXAMPLE 2

The structure of a photoelectric device was identical to the above example 1 excepting that the a-Si layer containing oxygen and nitrogen atoms was doped with group III and V elements. B and P were selected as doping impurity elements. The conditions for manufacturing the a-Si film containing oxygen and nitrogen atoms were as follows:

| Method: | Plasma CVD method | | |
|---|---|---|---|
| Source gas: | $SiH_4$ in $H_2$ | 10% | 100 sccm |
| | $CO_2$ | 100% | 25 sccm |
| | $N_2$ | 100% | 25 sccm |
| | $B_2H_6$ in $H_2$ | 2,000% | 10-150 sccm |
| | $PH_3$ in $H_2$ | 2,000% | 10-250 sccm |

Figure 29:
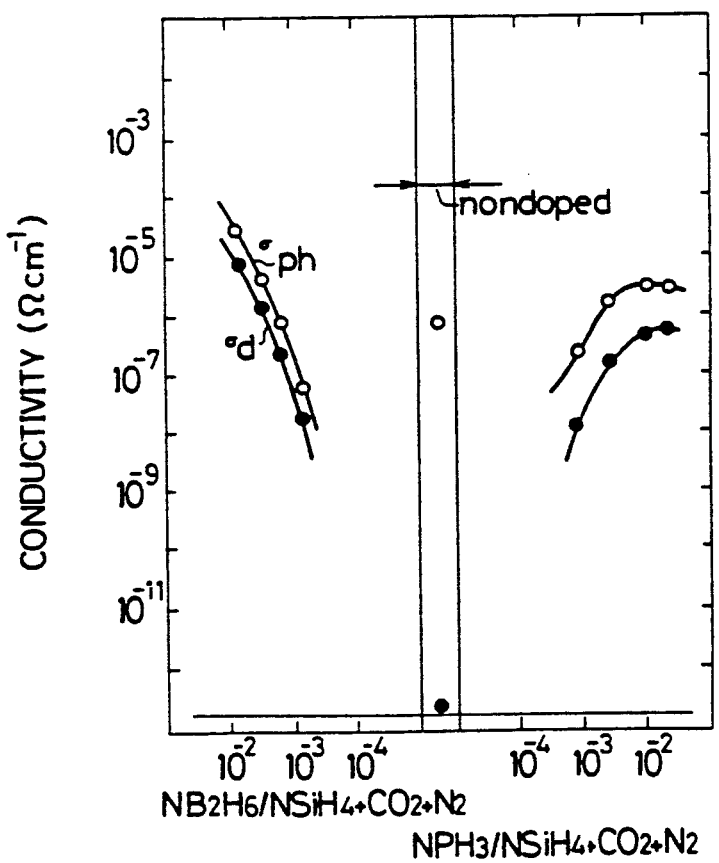
FIG. 29 is a graph showing how light and dark conductivities vary when an a-Si film containing oxygen and nitrogen atoms are doped with group III and group V atoms.

FIG. 29 graphically shows the light conductivity under illumination of AM1 (pseudo sunlight) 100 mW/cm² and the dark conductivity for the a-Si layer containing oxygen and nitrogen atoms constructed as described above.

EXAMPLE 3

Instead of ITO, Pt was deposited to the thickness of approximately 100 angstroms so as to define a Schottky junction, and a photoelectric device was manufactured as in the manner similar to that of examples 1 and 2. The resulting device was found to possess an excellent characteristic.

EXAMPLE 4

Instead of $SiH_4$, using a heavy hydride of $SiD_4$ and a halide of $SiF_4$, a similar photoelectric device was manufactured and found to possess an excellent property.

It will now be described as to a still further embodiment of this aspect of the present invention in detail below. This embodiment is basically the same in structure as the previously described embodiments excepting the fact that the a-Si layer contains not only oxygen atoms, but also carbon and nitrogen atoms. That is, in the present embodiment, using a mixture gas including $SiH_4$, a gas, such as $CO_2$, for providing oxygen and carbon atoms due to the glow discharge decomposition, and a gas, such as $N_2$ gas, for promoting the decomposition of the $CO_2$ gas and providing nitrogen atoms, an a-Si film containing therein oxygen, carbon, and nitrogen atoms is formed.

Several specific examples according to this embodiment will be given below.

EXAMPLE 1

On a glass substrate (100 mm × 100 mm, t = 1.0 mm) was formed a film of ITO to the thickness of 800 angstroms as a bottom electrode, and, while covering with a SUS mask provided with an opening of 7 mm × 7 mm, an a-Si layer containing oxygen, carbon, and nitrogen atoms was deposited thereon to the thickness of approximately 5,000 angstroms by the glow discharge decomposition. The conditions for fabricating the a-Si layer were as follows:

| Method: | Plasma CVD method | | |
|---|---|---|---|
| Source gas: | $SiH_4$ in $H_2$ | 10% | 100 sccm |
| | $CO_2$ | 100% | 25-100 sccm |
| | $N_2$ | 100% | 25-100 sccm |
| | $CO_2/N_2$ | 1 | |
| Substrate temp.: | 250° C. | | |
| Pressure inside reaction chamber: | 1.0 Torr | | |
| RF output: | 15 W | | |

On the a-Si layer was formed a film of Al by deposition to the thickness of approximately 5,000 angstroms as a top electrode. The a-Si layer 103 of the resulting photoelectric device was found to possess the characteristic described before.

EXAMPLE 2

Instead of ITO, Pt was deposited to the thickness of approximately 100 angstroms so as to define a Schottky junction, and a photoelectric device was manufactured in a manner similar to that of example 1. The device was found to possess the desired excellent characteristic.

EXAMPLE 3

Instead of $SiH_4$, using a heavy hydrogen of $SiD_4$ and a halide of $SiF_4$, a similar photoelectric device was manufactured. Excellent results were also obtained in this example.

While the above provides a full and complete disclosure of the preferred embodiment of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A photoelectric device comprising:
   first and second electrodes; and
   a body of amorphous silicon sandwiched between said first and second electrodes, said body comprising a first layer which is in contact with said first electrode and which includes a predetermined amount of oxygen atoms and at least one kind of hydrogen atoms, halogen atoms and heavy hydrogen atoms and has dark resistivity ranging from $10^{12}$ to $10^{14}$ ohms-cm, a predetermined level of photoconductivity at an optical bandgap at 2.0 eV or more and a thickness ranging from 200 to 2,000 angstroms, said photoconductivity at a bandgap of 2.0 eV or more being such that a ratio between dark resistivity and resistivity with light, with the amount of incident light at 100 mW/cm² (AM1), is equal to 100 or more, said predetermined amount of oxygen atoms being in a range between 15 and 30 at. %.

2. A photoelectric device as in claim 1, wherein said first layer further includes a predetermined amount of carbon atoms.

3. A photoelectric device as in claim 1, wherein said first layer further includes a predetermined amount of nitrogen atoms.

4. A photoelectric device as in claim 1, wherein said thickens is in a range from 300 to 700 angstroms.

5. A photoelectric device as in claim 1, wherein said first layer is non-doped.

6. A photoelectric device as in claim 1, including a second layer sandwiched between said first layer and second electrode, said second layer being a layer of amorphous silicon containing hydrogen atoms.

7. A photoelectric device as in claim 6, wherein said second layer is in contact with said first layer.

8. A photoelectric device as in claim 1, wherein said first layer has ($O_3$)-SiH structure.

9. A photoelectric device comprising:
a first electrode and a second electrode; and
a first layer of amorphous silicon sandwiched between said first and second electrodes, in contact with said first electrode, wherein said first layer is substantially intrinsic and includes oxygen atoms at density in the range of about 15-30 atomic percent and at least one kind of atoms selected from the group consisting of hydrogen atoms, halogen atoms and heavy hydrogen atoms, and said first layer has dark resistivity in the range of $10^{12}$ to $10^{14}$ ohms-cm, the thickness of said first layer being in the range of 200 to 2,000 angstroms, and the photoconductivity of said first layer at a bandgap of 2.0 eV being such that the ratio between dark resistivity and resistivity with light, with the amount of incident light at 100 mW/cm$^2$ (AM1), is 100 or more; and
a second layer of amorphous silicon which contains hydrogen atoms and is sandwiched between said first layer and said second electrode, in contact with said first layer.

10. An amorphous semiconductor photoelectric device comprising:
a first layer of an amorphous silicon material which contains oxygen and at least one element selected from the group consisting of carbon and nitrogen and has electrical resistivity in excess of $10^{12}$ ohm-cm and a ratio of dark resistivity to light resistivity at illumination of 100 mW/cm$^2$ of at least $10^2$ at a bandgap of at least 2.0 eV; and
a first electrode in electrical communication with one side of said first layer and a second electrode in electrical communication with a second side of said layer.

11. A device as in claim 10 including an intrinsic layer between said first layer and said second electrode.

12. An amorphous semiconductor photoelectric device comprising:
a layer of an amorphous silicon material which contains oxygen and at least one component selected from the group consisting of hydrogen, a halogen and heavy hydrogen and has electrical resistivity in excess of $10^{12}$ ohm-cm and a ratio of dark resistivity to light resistivity at illumination of 100 mW/cm$^2$ of at least $10^2$ at a bandgap of at least 2.0 eV; and
a first electrode in electrical communication with one side of said first layer and a second electrode in electrical communication with a second side of said layer.

13. A device as in claim 12 in which the electrodes are in ohmic contact with the respective sides of the layer.

* * * * *